United States Patent [19]

Eitan et al.

[11] Patent Number: 5,021,847
[45] Date of Patent: Jun. 4, 1991

[54] SPLIT GATE MEMORY ARRAY HAVING STAGGERED FLOATING GATE ROWS AND METHOD FOR MAKING SAME

[75] Inventors: Boaz Eitan, Sunnyvale; Reza Kazerounian, Alameda, both of Calif.

[73] Assignee: WaferScale Integration, Inc., Fremont, Calif.

[21] Appl. No.: 258,952

[22] Filed: Oct. 17, 1988

Related U.S. Application Data

[63] Continuation-in-part of Ser. No. 762,582, Aug. 2, 1985, Pat. No. 4,868,629, which is a continuation of Ser. No. 610,369, May 15, 1984, Pat. No. 4,639,893.

[51] Int. Cl.$^5$ .................... H01L 29/68; H01L 27/02; H01L 27/10
[52] U.S. Cl. .................... 357/23.5; 357/23.9; 357/23.11; 357/41; 357/45; 365/185
[58] Field of Search .................... 357/23.5, 23.9, 23.11, 357/41, 45; 365/185

[56] References Cited

U.S. PATENT DOCUMENTS

| | | | |
|---|---|---|---|
| 4,122,544 | 10/1978 | McElroy | 365/185 |
| 4,142,926 | 3/1979 | Morgan | 148/187 |
| 4,173,791 | 11/1979 | Bell | 365/182 |
| 4,173,818 | 11/1979 | Bassous et al. | 29/571 |
| 4,257,832 | 3/1981 | Schwabe et al. | 148/187 |
| 4,267,558 | 5/1981 | Guterman | 357/41 |
| 4,274,012 | 6/1981 | Simko | 307/238.3 |
| 4,297,719 | 10/1981 | Hsu | 357/23 |
| 4,300,212 | 11/1981 | Simko | 365/185 |
| 4,318,216 | 3/1982 | Hsu | 29/571 |
| 4,328,565 | 5/1982 | Harari | 365/185 |
| 4,334,292 | 6/1982 | Kotecha | 365/182 |
| 4,336,603 | 6/1982 | Kotecha et al. | 365/182 |
| 4,380,866 | 4/1983 | Countryman, Jr. et al. | 29/577 |
| 4,387,447 | 6/1983 | Klaas et al. | 365/185 |
| 4,409,723 | 10/1983 | Harari | 29/571 |
| 4,412,311 | 10/1983 | Miccoli et al. | 365/185 |
| 4,426,764 | 6/1984 | Kosa et al. | 29/571 |
| 4,462,090 | 7/1984 | Iizuka | 365/185 |
| 4,471,373 | 9/1984 | Shimizu et al. | 357/41 |
| 4,495,693 | 6/1985 | Iwahashi et al. | 29/571 |
| 4,561,004 | 12/1985 | Kuo et al. | 357/23.5 |
| 4,639,893 | 1/1987 | Eitan | 365/185 |
| 4,825,271 | 4/1989 | Tanaka et al. | 357/23.5 |
| 4,868,629 | 9/1989 | Eitan | 365/185 |

FOREIGN PATENT DOCUMENTS

| | | |
|---|---|---|
| 816931 | 7/1969 | Canada . |
| 045578A2 | 2/1982 | European Pat. Off. . |
| 2437676 | 9/1979 | France . |
| 2468972 | 10/1980 | France . |
| 158078 | 12/1982 | German Democratic Rep. . |
| 52-63684 | 5/1977 | Japan . |
| 53-89686 | 7/1978 | Japan . |
| 54-156484 | 10/1979 | Japan . |
| 55-156369 | 12/1980 | Japan . |
| 56-71971 | 6/1981 | Japan . |
| 57-76878 | 5/1982 | Japan . |

(List continued on next page.)

OTHER PUBLICATIONS

Barnes et al., "Operation and Characterization of N-Channel EPROM Cells", Solid State Electronics, vol. 21, 1978, pp. 521-529.

(List continued on next page.)

Primary Examiner—Andrew J. James
Assistant Examiner—Ngan Van Ngo
Attorney, Agent, or Firm—Skjerven, Morrill, MacPherson, Franklin & Friel

[57] ABSTRACT

An EPROM array has plural rows of split gate transistors, where each transistor includes a floating gate and the floating gate has corner portions. A bit-line defining edge is formed on each floating gate between two of the corners. The bit-line defining edges of first and second floating gates respectively belonging to first and second rows are patterned so that these edges protrude into opposed side areas of a bit line implant window. This arrangement minimizes resistance changes in the bit lines due to mask misalignment. The misalignment insensitivity permits relaxation of dimensional constraints. Cells of the memory array can be drawn to have smaller areas.

22 Claims, 17 Drawing Sheets

FOREIGN PATENT DOCUMENTS

| | | | |
|---|---|---|---|
| 57-96572 | 6/1982 | Japan . | |
| 58-206165 | 12/1983 | Japan . | |
| 1-19595 | 1/1989 | Japan | 365/185 |
| 1-181572 | 7/1989 | Japan | 357/23.5 |
| 2073484A | 10/1981 | United Kingdom . | |

OTHER PUBLICATIONS

Guterman et al., "An Electrically Alterable Nonvolatile Memory Cell Using a Floating Gate Structure", IEEE Journal of Solid State Circuit, vol. SC14, No. 2, Apr., 1979, pp. 498–508.

Shirota et al., "A New NAND Cell for Ultra High Density 5V–Only EEPROMS" pp. 33, 34.

"How SEEQ is Pushing EEPROMS to 1-Mb Densities", Electronics, Aug. 21, 1986 pp. 53–56.

"New Memory-Cell Design May Lower EPLD Costs", Electronics, Sep. 4, 1986, p. 39.

"High-Density Flash EEPROMS are About to Burst on the Memory Market", Electronics, Mar. 3, 1988, pp. 47–48.

Baglee et al. "Lightly Doped Drain Transistors for Advanced VLSI Circuits", IEEE Transactions, Electron Devices, vol. ED-32, No. 5, May 1985, pp. 896-et seq.

Takeda et al., "Submicrometer MOSFET Structure for Minimizing Hot-Carrier Generation", IEEE Transactions, Electron Devices, vol. ED-29, No. 4, Apr. 1982, pp. 611-et seq.

Koyanagi et al., "Optimum Design of N+-N- Double-Diffused Drain MOSFET to Reduce Hot-Carrier Emission", IEEE Transactions, Electron Devices, vol. ED-32, No. 3, Mar., 1985, pp. 562-et seq.

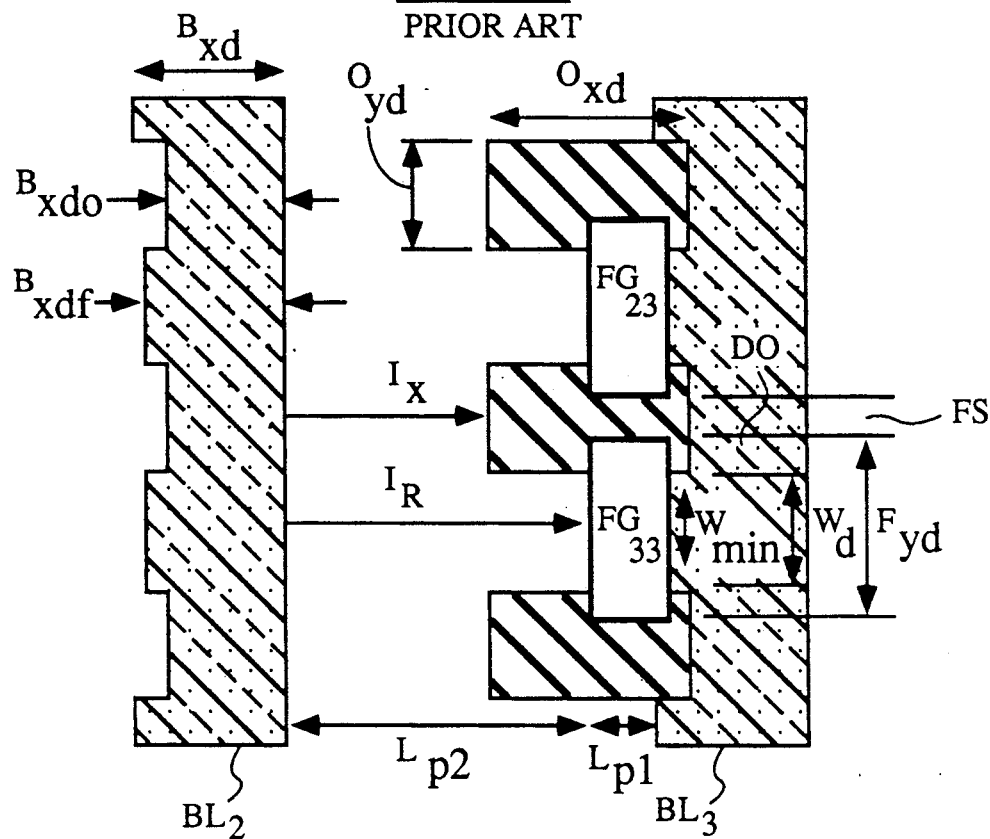
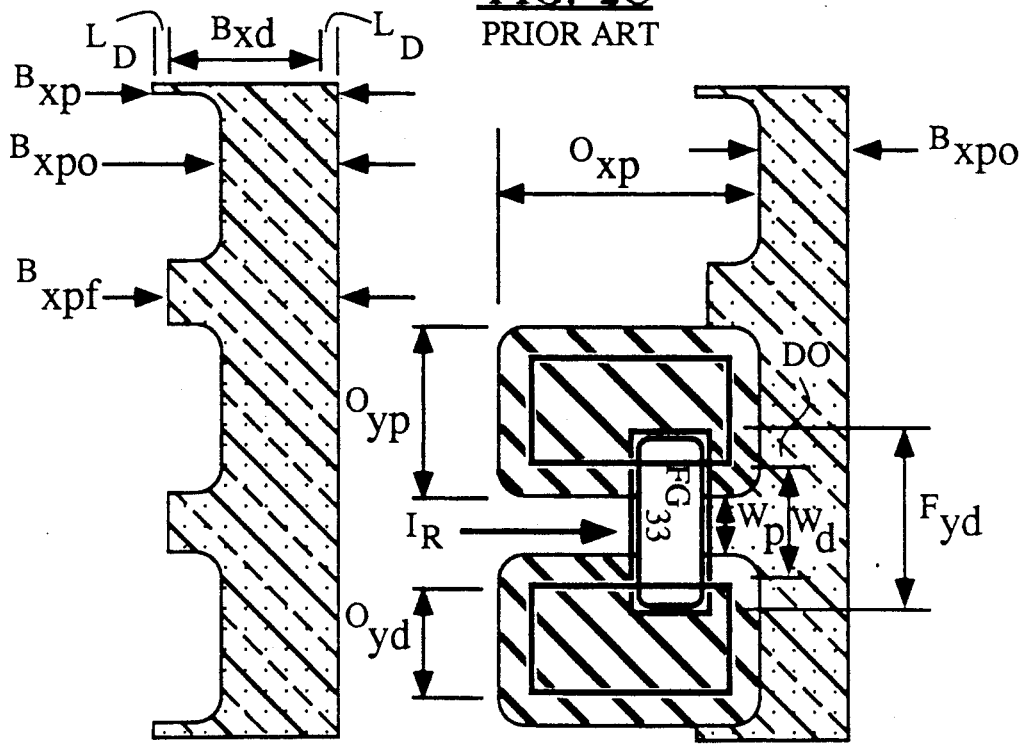

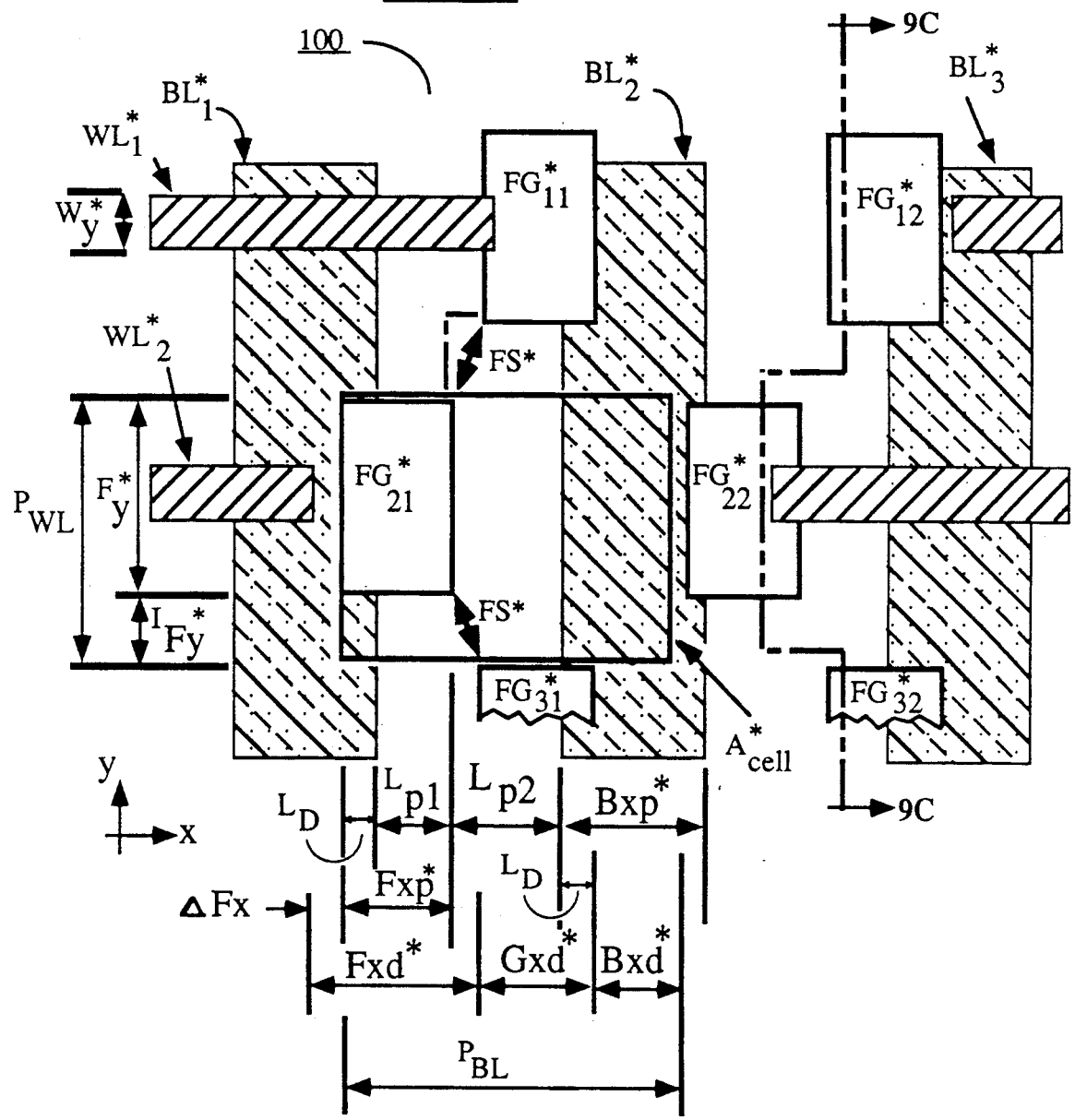

SPLIT GATE MEMORY ARRAY HAVING STAGGERED FLOATING GATE ROWS AND METHOD FOR MAKING SAME

CROSS-REFERENCE TO RELATED APPLICATIONS

This is a continuation in part of application Ser. No. 06/762,582, filed Aug. 2, 1985 and entitled "A Self-Aligned Split Gate EPROM", the which issued as U.S. Pat. No. 4,868,629 on Sept. 19, 1989, latter application is assigned to the assignee of present invention and is a continuation in part of application Ser. No. 06/610,369, filed May 15, 1984, entitled "A Self-Aligned Split Gate EPROM", which issued as U.S. Pat. No. 4,639,893 on Jan. 27, 1987. The disclosures of both said Applications are incorporated herein by reference.

BACKGROUND OF THE INVENTION

1. Field of the Invention

This invention is generally directed to non-volatile memory arrays (e.g. EPROMs) and more particularly to memory arrays having plural memory cells, wherein each cell comprises an asymmetrical split gate structure including a fully insulated floating gate which can be charged to a programmed state by injection of hot electrons through an insulator and an electrically accessible control gate which can be used to address the memory cell. The invention is more specifically directed to a structure and/or method for improving the packing density and/or manufacturing yield of such a memory array.

2. Description of the Related Art

Co-pending application Ser. No. 06/762,582, discloses a memory array having a virtual ground structure. In such a structure, a plurality of elongated conductive semiconductor regions referred to as bit lines are formed integrally in a semiconductor substrate so as to each have opposed first and second edge portions. The opposed edge portions of each bit line respectively function as the drain of a first split gate transistor and as the source of a laterally adjacent second split gate transistor. The structure and operating characteristics of the split gate transistor are described in U.S. Pat. No. 4,409,723 issued to E. Harari Oct. 13, 1983. The contents of U.S. Pat. No. 4,409,723 are incorporated herein by reference.

While the virtual ground structure provides an advantageous arrangement for packing a large number of memory cells into the limited area of an integrated circuit chip and for manufacturing such chips on a mass production basis, it has its limitations. One object of the present invention is to provide a structural layout which enables designers to overcome packing density limitations of the virtual ground structure disclosed in Ser. No. 06/762,582. An appreciation of the interplay between functional components of the virtual ground structure and the manufacturing steps employed to form them will facilitate understanding of how the packing density limitations arise and how the invention overcomes them.

FIG. 1 is a schematic diagram of a memory array 10 having a virtual ground structure such as one described in the above cited application Ser. No. 06/762,582. Briefly, the memory array 10 is integrally formed on a semiconductive substrate 15 (FIG. 3) so as to include a relatively large number (j times k) of split gate transistors $Q_{11}, Q_{12}, Q_{13}, \ldots Q_{jk}$, arranged in linear rows and columns thereby forming a rectangular matrix. Diffused in the substrate 15 are large number of bit lines, $BL_1, BL_2, BL_3, \ldots, BL_{k+1}$, where the number k is an integer which by way of example, may be equal to a power of two such as 256, 512, 1024 or 2048. The bit lines are composed of a conductive semiconductor material such as heavily doped N type silicon. Each bit line is elongated to extend across the substrate in a longitudinal direction (y direction). Plural bit lines are repeated at a predetermined first pitch $P_{BL}$ in the lateral direction (x direction) across the surface of the substrate 15. Portions denoted as D and S at opposed left and right edges, 11 and 12, of each of bit lines $BL_2$ through $BL_k$ respectively serve as drain and source regions of transistors $Q_{11}$–$Q_{jk}$.

The array 10 is further configured to have a large number of conductive word lines, $WL_1, WL_2, \ldots, WL_j$, repeated across the surface of the substrate 15 at a predetermined pitch $P_{WL}$ in the y direction. (The value j is an integer which, by way of example, may equal a multiple of two such as 256, 512, 1024 or 2048.) The word lines are preferably heavily doped strips of polycrystalline silicon that are disposed to insulatively overlap both the bit lines $BL_1$ through $BL_{k+1}$ and portions of the substrate surface between the bit lines. The word lines $WL_1$–$WL_j$ extend orthogonally over the bit lines $BL_1$–$BL_{k+1}$ such that each word line $WL_i$ of a row i (i being an integer in the range $1 \leq i \leq j$) defines and interconnects control gate portions 14 of a set of transistors $Q_{i1}$–$Q_{ik}$ lying in the same row i to a corresponding node $N_{Xi}$ of an X-address unit 18. The X-address unit 18 selectively activates an individual one of the word lines $WL_1$–$WL_j$ to thereby address a unique row of transistors (memory cells) in the memory array 10 during reading or programming of the array.

The packing density of the array 10 is set once the bit line and word line pitch values, $P_{BL}$ and $P_{WL}$, are selected. The x-by-y substrate area $A_{cell}$ attributed to each cell of the memory array 10 is fixed to the product $P_{BL} P_{WL}$. Those skilled in the art will readily appreciate that this attributed cell area $A_{cell}$ is a very important factor in the production of integrated circuit chips. It determines how many dies can be packed on each production wafer, the manufacturing yield of the production line, and whether a die of preselected dimensions can be mass produced to have a relatively large memory capacity of, say for example, 1M bits, 4M bits, or even higher (M=1,048,576). These latter factors determine whether or not an IC chip of a specific design will satisfy industry demands for increased memory capacity at lower costs per bit. To satisfy industry demand, it is generally desirable to minimize die area, maximize the number of memory cells on each die and maximize the number of die on each wafer in a manner which concurrently assures that the electrical and mechanical requirements of a prespecified circuit design are met.

The pitch values, $P_{BL}$ and $P_{WL}$, cannot be selected arbitrarily. They are intertwined with both the functional design requirements of the integrated circuit and the miniaturization capabilities of available manufacturing processes. In the configuration of FIG. 1, for example, the bit lines $B_{L1}$–$BL_{k+1}$ must be designed to couple the source and drain regions of transistors in adjacent transistor columns to respective contact nodes $N_{Y1}$ through $N_{Y(k+1)}$ of the array 10 in a manner which assures that prespecified source and drain voltage levels will develop at the source and drain regions of the transistors. The contact nodes are vertically oriented vias which connect the diffused bit lines $BL_1$-$BL_{k+1}$ of the substrate to metal lines $ML_1$ through $ML_{k+1}$ overlying the substrate. The metal lines couple the bit lines to a Y-addressing/programming/sensing unit 20. There is a one-to-one correlation between each of the metal lines and the diffused bit lines, so the metal lines $ML_J$ through $ML_{k+1}$ and the bit lines $BL_J$ through $BL_{k+1}$ are preferably repeated over the surface of the substrate at the same pitch $P_{BL}$.

Unit 20, which will also be referred to as the Y-address unit 20, includes circuitry for switchably setting the voltage of each of the contact nodes, $NY_1$-$N_{Y(k+1)}$, to one of a preselected plurality of voltage levels, including a low voltage $V_L$, (e.g., ground) an intermediate voltage $V_I$ (e.g., +2 volts) and a high voltage $V_H$ (e.g., +9 volts). The Y-address unit 20 is actuated such that a desired one of the transistors $Q_{11}$-$Q_{jk}$ can be individually addressed for programming or reading.

Since the bit lines $BL_J$-$BL_{k+1}$ are not perfect electrical conductors but rather impurity doped (N+) semiconductor regions and since semiconductor materials typically have resistivity values much higher than the metal materials normally used to form the metal, lines, $ML_1$- $ML_{k+1}$, vertical segments of each bit line (we will use bit line $BL_k$ as an example) may be characterized as having nonnegligible segment resistances $R_{y1}$, $R_{y2}$, $R_{y3}$, ..., $R_{yj}$. The resistance value of each segment is proportional to its length and inversely proportional to its width. The total resistance separating contact node $N_{Yk}$ from the source region S of the transistor, $Q_{1k}$, (and incidentally for the purpose of simplification $Q_{1k}$ will be assumed here to be a transistor that is most distally located in an electrical sense from contact node $N_{Yk}$), depends on the sum of the individual segment resistances $R_{y1}$ through $R_{yj}$ of bit line $BL_k$. The total resistance separating the drain region D of transistor $Q_{1k}$ from contact node $NY_{(k+1)}$ similarly depends on the sum of the segment resistances in bit line $BL_{k+1}$. Thus, when the Y-address unit 20 switches node $N_{Yk}$ to the low potential level $V_L$ so that node $N_{Yk}$ will act as a virtual ground, and switches node $N_{Y(k+1)}$ to an intermediate or high level ($V_I$ or $V_H$) so that node $N_{Y(k+1)}$ will provide a drain potential that enables either the reading or programming of transistor $Q_{1k}$, the voltage at the source region S of transistor $Q_{1k}$ may be higher than a desired virtual ground level (due to a voltage drop generated across the segment resistances of bit line $BL_k$ when a prespecified reading or programming current flows through the bit line) and the voltage at the drain region D of transistor $Q_{1k}$ may be lower than a desired drain level (due to current flow through the segment resistances of bit line $BL_{k+1}$).

Those skilled in the art will, of course, appreciate that it is customary to provide plural contact nodes (vertical vias) at multiple points along the length of each bit line for coupling the bit line to an overlying metal line and minimizing the resistance effects of the diffused bit line. By way of example, bit line $BL_k$ would ordinarily have a number of contact nodes $N_{1k}$ through $N_{mk}$ (not shown) distributed along its length, where m is an integer much larger than 2, i.e., m=20. Only one contact node $N_{Yk}$ is shown along the length of bit line $BL_k$ in FIG. 1 for the sake of simplifying the discussion. It will be understood that in the case of a bit line having plural contact nodes, the transistor regions located approximately midway between adjacent contact nodes of the bit line are usually the ones that are most distal in the electrical sense and suffer most from increased bit line resistance.

Referring still to the structure of FIG. 1, it can be appreciated that if all the transistors, and especially the transistors which are electrically most distal from the contact nodes of each bit line, i.e. $Q_{1k}$, are to operate properly, care must be taken to assure that the effective channel width of each transistor is equal to or greater than a minimum effective width $W_{min}$ necessary for conducting predetermined, minimum read and write currents, $I_{Rmin}$ and $I_{Pmin}$, and further that the summed y-direction resistance values of the bit lines, i.e., $BL_k$ and $BL_{k+1}$, are each kept below a design maximum $R_{Ymax}$. This means that the effective channel width of each transistor has to be controlled during fabrication to assure it is at least as wide as the minimum width $W_{min}$ and that the width and length dimensions of segment resistances $R_{y1}$, $R_{y2}$, ... $R_{yj}$ have to be controlled during fabrication so as to assure that the sum of their resistance values will not exceed the design maximum $R_{Ymax}$.

This is where the selection of the pitch values, $P_{BL}$ and $P_{WL}$, comes into play. Those skilled in the art will appreciate that precise control of the effective channel widths of densely packed transistors and precise control of the widths of the segment resistances $R_{y1}$, $R_{y2}$, ... $R_{yj}$ is difficult to achieve when integrated circuit chips are manufactured on a mass production scale. As such, integrated circuit designers are constrained in how small they can make the values of the bit line and word line pitches, $P_{BL}$ and $P_{WL}$.

The basis for these constraints can be appreciated better by referring to FIGS. 2A-2C. FIG. 2A is a top plan view of a portion of the memory array 10 of FIG. 1 as it generally appears after lithographic design but before it is actually fabricated into an integrated circuit. FIG. 2B shows an enlarged view of a portion of FIG. 2A. FIG. 2C, shows a portion of the device after fabrication. The discussion will focus mainly on FIG. 2A here. It is sufficient to note for now that with respect to FIGS. 2B and 2C that the shapes in the lithographic layout of FIG. 2A are distorted during fabrication by etch shrinkage, dopant diffusion, oxide growth, and other process mechanisms thereby producing the shapes shown in FIG. 2C.

In FIG. 2A first through third word lines $WL_1$-$WL_3$ are shown crossing over semiconductive (N+) bit lines $BL_1$-$BL_3$, with parts of an oxide insulation 30 (FIG. 3) and portions of the word lines $WL_1$-$WL_3$ removed to expose lightly doped (P−) inter-channel regions 15b of the substrate, lightly doped (P−) channel regions 15c of the substrate, and a rectangular matrix of floating gates $FG_{11}$ through $FG_{33}$ belonging to respective transistors $Q_{11}$ through $Q_{33}$. The floating gates $FG_{11}$-$FG_{33}$ are insulatively supported above the bit lines by a thin gate oxide layer 30a which may be seen in the cross-sectional views taken along lines 3—3, 4—4, 5—5 and illustrated respectively in FIGS. 3, 4 and 5. Thicker field oxide portions, $FO_{11}$ through $FO_{33}$, of the oxide insulation 30 are positioned between the floating gates as seen in FIGS. 2A-2C, 4 and 5. FIG. 2A is not drawn entirely to scale. The floating gates $FG_{12}$-$FG_{33}$ of bit lines $BL_2$ and $BL_3$ are shown to be spaced relatively far apart from their corresponding source sections on respective bit lines $BL_1$ and $BL_2$. This large spacing was used to avoid cluttering in the illustration of FIG. 2A. Distances $L_{p1}$ and $L_{p2}$ are normally of approximately the same size (i.e., $L_{p1}=1.3$ micron and $L_{p2}=1.1$ micron) as is better seen in FIG. 3.

Referring to the cross sectional view of FIG. 3, the thin layer 30a, or gate oxide, (which is preferably composed of silicon dioxide) spaces a control gate portion 14 and a floating gate portion 16 of each transistor closely (approx. 500 Å or less) to the top surface 15a of the semiconductive substrate 15 so as to enable each of the control and floating gate portions, 14 and 16, to control electrical conduction through channel regions 15c of the substrate. The channel regions 15c are located between edge portions, S and D, of bit lines $BL_1$-$BL_{k+1}$ which are preselected to function as either the source or drain region of a split gate transistor. Referring momentarily to FIG. 4 it should be noted that the bit line edges also have portions X which are not designated to function as either a source or a drain and these portions X will be referred to as nonsource/nondrain portions. Referring back to FIG. 3, respective read and programming currents, $I_R$ and $I_P$, can, under certain conditions, flow through an inversion layer induced in the channel region 15c of a selected transistor when the control gate 14 of the transistor is activated.

Referring to FIG. 4, the thick field oxide portions FO of the oxide insulation 30 usually have thicknesses of 1000 Å or greater and more typically 5000 Å or greater. These field oxide portions FO are grown to be interposed between nonsource/nondrain portions X of adjacent bit lines, as shown, so as to inhibit leakage current $I_x$. Such use of the field oxide portions is commonly referred to as oxide isolation.

Referring to FIG. 5, and also to FIGS. 2B and 2C, the field oxide portions FO have a tendency to expand by imprecisely controllable distances in the x and y directions, and generate a "Bird's Beak" condition. By way of example, the Bird's Beak expansion can be on the order of 0.6 micron in a layout which generally follows a 1.2 micron design rule. This can have substantial consequences on the options available to chip designers. When Bird's Beak expansion occurs, respective left and right edge portions 16a, 16b of the floating gates 16 can be lifted away from the substrate by substantial distances, i.e., greater than 200-500 Å, so that these edge portions 16a, 16b are prevented from inducing substantial inversion in the underlying substrate 15 even when such inversion is desired. Normally, a relatively small designed-in overlap DO (e.g. 0.1 micron), is desired between the floating gates FG and the field oxide portions FO. The designed-in overlap DO guards against misalignment between a later-to-be-described poly 1 patterning step (that defines the floating gates $FG_{11}$-$FG_{33}$) and other patterning steps. If misalignment in the Y-direction is less than the designed-in overlap DO, the thickness of the field oxide portions in the zone of the overlap do inhibit the misalignment from generating a situation wherein an undesirable conductive path might be formed between adjacent bit lines, the undesirable conductive path being one that is activated by a misaligned word line but not controlled by a floating gate. This protection against misalignment induced problems is a beneficial aspect of the field oxide portions, but there is a detrimental aspect as well.

Referring to FIGS. 2B and 2C, lateral growth of the field oxide in the y-direction, beyond the dimension of the designed-in overlap DO (a phenomenon which is difficult to control to a high degree of precision), can reduce the post-fabrication, effective channel width $W_p$ of the transistors. When the effective width $W_p$ of a transistor is reduced below a required design minimum $W_{min}$ the read current $I_R$ of the transistor (which is a function of the effective channel width under the floating gate $I_R=f(W_p)$) might diminish below a design minimum $I_{Rmin}$ and the array 10 may then fail to operate according to specifications. To guard against this, the floating gates are usually drawn to have an overall y-direction dimension, $F_{yd}=2DO+W_d$, which is significantly larger than the minimum effective width $W_{min}$ actually needed for producing the minimum read current $I_{Rmin}$. That is, the drawn effective width $W_d$ (FIG. 2B) is chosen to be sufficiently larger than the minimum effective width $W_{min}$ so that even under worst case expansion of the Bird's Beak (e.g. 0.6 micron beyond each side of the designed-in overlap DO) the post-fabrication effective channel width $W_p$ would still be large enough to allow the minimum read current $I_{Rmin}$ to flow. (E.g for a preselected $W_{min}$ of 1.7 microns, the drawn width would be chosen to be $W_d=1.7+2(0.6)=2.9$ microns.) As a result of this precaution, the word line pitch $P_{WL}$, which is determined by the drawn effective width $W_d$ plus twice the designed-in overlap DO plus a separation distance FS that is to be discussed later ($P_{WL}=W_d+2DO+FS$), is forced to be significantly larger than would otherwise be necessary. By way of example, in the design of a so called non-staggered virtual ground array having a word line pitch of 4.2 microns, 1.7 microns are assigned for the minimum effective width $W_{min}$, 1.2 microns are assigned for Bird's Beak growth, 1.3 microns are consumed by a floating gate separation distance FS to be discussed later, and 0.2 microns are used up by the designed-in overlap DO. From the above, it can be seen that precautions taken against mask misalignment and Bird's Beak expansion cause the attributed area $A_{cell}=P_{WL}P_{BL}$ of each memory cell to be larger than otherwise necessary at least as far as the word line pitch $P_{WL}$ is concerned.

It may appear that if the attributed cell area $A_{cell}=P_{WL}P_{BL}$ cannot be reduced by decreasing the word line pitch $P_{WL}$ (because of the above precautions), then perhaps cell area could be reduced by selecting a smaller bit line pitch $P_{BL}$. But here again, there are interactions between process related factors including excessive growth of the field oxide, excessive bit line resistance, mask misalignment, and the electrical characteristic requirements of the fabricated transistors which need to be considered. With respect to these factors, it is useful to briefly review how integrated circuits are fabricated in mass production fashion.

In one method of fabricating the memory array 10, the thick field oxide portions FO are grown on the planar surface of a mono-crystalline silicon substrate using a first lithographic pattern or "mask." A first polysilicon layer (poly-1 layer) is formed on the substrate after the field oxide is grown. The poly-1 layer is patterned (e.g., plasma etched) using a second lithographic mask to define floating gates $FG_{11}$-$FG_{jk}$ as a plurality of linearly arranged rows and columns. The floating gate pattern will have lithographically drawn original x and y dimensions, $F_{xd}$ and $F_{yd}$, (FIG. 2B), but after etching, the floating gate shapes tend to shrink to smaller post-fabrication dimensions $F_{xp}$ and $F_{yp}$ as indicated in FIG. 2C. It is worthwhile to note here that etch shrinkage is accentuated at corner portions of the drawn floating gate shapes in comparison to flat side portions of the drawn floating gate shapes and that the corners have a tendency to become rounded as they shrink. It will be seen that the invention takes advantage of this phenomenon. This corner rounding phenomenon may take place regardless of whether the floating gate pattern is defined by photolithographic masking or plasma etch or other patterning techniques.

After the patterning of the floating gates, a photoresist layer is deposited and patterned by a third lithographic mask to have an implant window defined therethrough (refer to FIG. 7A). The photoresist pattern is preferably aligned relative to the floating gates such that the implant window (e.g., 50a of FIG. 7A) has a first window-edge (50a-1) aligned midway between the edges of floating gates in a single column, and an opposed second window-edge (50a-2) which is spaced away from edges of the floating gates in the single column.

Next the bit lines $BL_1-BL_{k+1}$ are ion implanted in a self-aligning manner using bit-line-defining edges (E1 through E4 of FIG. 7A, for example) of the floating gates (FG1 through FG4, for example) and portions of the photoresist (50) in combination as a mask. After the bit line dopants have been implanted, the photoresist (50) is removed, insulation is formed on the surfaces of the floating gates, and the implanted bit line dopants are diffused laterally to extend the bit line shapes under the floating gate edges by a diffusion determined distance $L_D$ as indicated in FIG. 3.

In a later step, the word lines $WL_1-WL_j$ are formed by depositing a layer of conductive material on the insulation covering the floating gates and patterning this deposited layer with yet a fourth mask. The word lines are preferably composed of heavily doped polysilicon (poly-2 layer), as are the floating gates (poly-1 layer).

Referring to FIGS. 2A–2C, the bit lines $BL_1-BL_{k+1}$ will have a lithographically drawn, x-direction dimensions, $B_{xd}$, $B_{xdo}$, $B_{xdf}$ at various portions thereof as shown in FIG. 2B, but because of fabrication factors such as etch shrinkage and lateral dopant diffusion, the bit lines will be distorted in shape and will have different post-fabrication dimensions $B_{xp}$, $B_{xpo}$, $B_{xpf}$ as shown in FIG. 2C. It will be noted in comparing FIGS. 2B and 2C that the field oxide portions FO enlarge from drawn x,y dimensions $O_{xd}$, $O_{yd}$ to larger post-fabrication dimensions $O_{xp}$, $O_{yp}$ due to lateral expansion. As a result, the field oxide portions FO affect both the oxide dependent, width dimension, $B_{xpo}$, of the bit lines and the post-fabrication effective channel width $W_p$ of the transistors. It should be obvious, incidentally, that some of the features shown in FIG. 2A (i.e. word lines, floating gates and oxide portions) are omitted in FIGS. 2B and 2C so that the changes in bit line, oxide and floating gate shapes can be better seen.

When the bit line pitch $P_{BL}$ is selected, it must include at least the following two predetermined overlap lengths which determine the electrical characteristics of the transistors: $L_{p1}$, which is a predetermined channel length under control of the floating gates; and $L_{p2}$, which is a predetermined channel length under control of the control gates (word lines). After these two overlap lengths, the selected bit line pitch $P_{BL}$ will include a floating gate affected, dimension, $B_{xdf}$, of the bit lines plus the expected side diffusion $L_D$ of the bit lines. In a previous nonstaggered virtual ground design having a bit line pitch of 4.2 microns, 1.8 microns of the pitch were consumed by the drawn width $B_{xd}$, 1.3 microns by $L_{p1}$ and 1.1 microns by $L_{p2}$. The values of $L_{p1}$ and $L_{p2}$ were fixed by certain electrical characteristics desired for the split gate transistors. The value of $B_{xd}$, as will be seen in the following detailed discussion, was constrained to some extent by concerns for generating excessive bit line resistances. It was also constrained to some extent by concerns about excessive growth of the field oxide portions FO. Also, the design rules of the metal lines ML generated some constraints.

The resulting attributed cell area $A_{cell} = P_{BL} P_{WL}$ for the exemplary pitch values given above, namely $P_{BL} = 4.2$ microns and $P_{WL} = 4.2$ microns, was approximately 17.5 microns$^2$. The above description seems to indicate that nothing can be done to reduce cell area further unless one is willing to sacrifice electrical performance and/or manufacturing yield. It will be seen from the following that it is possible to reduce cell area even further without sacrificing electrical performance and manufacturing yield.

SUMMARY OF THE INVENTION

It is an object of the present invention to provide a split gate memory array characterized by increased packing density and/or higher manufacturing yield and/or consistency in performance from one mass produced batch to the next (e.g. homogeneous read current magnitudes from one production batch to the next).

In accordance with the invention, the floating gates of a first row, in an array having multiple rows of split gate transistors, are shifted or "staggered" out of columnar alignment with the floating gates of an adjacent second row so that the minimum distance between the floating gates of the first row and the floating gates of the second row is measured in corner to corner fashion, between corner portions of the respective floating gates in the first and second rows, rather than in flat to flat fashion between flat portions of the respective floating gates. The floating gates of a third row, adjacent to the first row, preferably remain in columnar alignment with the floating gates of the second row so that minimal distance between the first and third row floating gates is also measured corner to corner.

If the staggered first row is shifted along an arc shaped path to bring the first row closer to the second row while floating gates of the first row are restrained to contacting an imaginary design rule circle, minimal distance between the staggered first floating gate row and the columnarly aligned second floating gate row can be arranged so that such distance is measured at a substantially large angle (preferably 30 degrees or more) relative to the pitch of the rows. If the source-to-drain orientation of transistors in the first row is inverted relative to the source-to-drain orientation of transistors in the second and third rows, the angle can be increased. Using this technique of increasing the angle by inverting the source to drain orientation, the row to row pitch of the array can be made substantially smaller than the corner to corner distance measurement between the floating gates of the first and second rows.

In one embodiment of the invention, a plurality of spaced apart bit lines are integrally formed to extend longitudinally in a semiconductive substrate such that the bit lines each have laterally opposed left and right sides. Linear rows of floating gates are distributed across the substrate in spaced apart fashion to pass over each of the bit lines. Each floating gate has a bit-line defining edge portion which is used during fabrication to define a corresponding edge portion of an underlying bit line. Each floating gate is positioned such that, after fabrication, the bit-line defining edge portion thereof will overlap either the left or the right side of its corresponding bit line by a diffusion-determined overlap distance. Each floating gate further has an effective-length determining edge which is opposed to the bit-line defining edge. The effective length determining edge of each floating gate is defined simultaneously with the bit-line defining edge so that distance between the two edges can be set with precision. The floating gate rows are staggered with respect to one another such that the bit-line defining edges of the floating gates of a first row are used as part of a bit-line implantation mask to define the left sides of their respective bit lines and the bit-line defining edges of the floating gates of a second row are used as part of the same bit-line implantation mask to define the right sides of their respective bit lines.

When split gate transistors are formed, the floating gates of the transistors are disposed near the drain region of the transistors and spaced apart from the source regions so the transistors have functionally asymmetric geometries. Thus, in the one embodiment described above, the source-to-drain orientation of transistors in the first row of transistors opposes the source-to-drain orientation of transistors in the second row of transistors. The opposed source-to-drain orientations of the rows is alternated, one row after the next so that odd and even numbered rows will have opposed orientations. This causes each bit line to have sequenced along each of its left and right edges, regions that sequentially and alternately serve as respective source and drain portions of longitudinally adjacent transistors.

The result of this opposed orientation of rows is that minimal distance between floating gates of adjacent rows is measured corner to corner rather than flat to flat. As a result, the pitch between transistor rows can be reduced in comparison to the pitch between transistor rows of a nonstaggered layout. Cell area is reduced by reducing row to row pitch and packing density of memory cells can be increased as a consequence. When the pitch between transistor rows is reduced, the length of each bit line can be reduced, and since bit line resistance is proportional to length, bit line resistance can be reduced. Furthermore, since capacitance is proportional to area, capacitance between the bit line and the substrate may be reduced as the length and consequently the area of the bit line to substrate interface is reduced. Electrical performance benefits from both the reduction of bit line resistance and the reduction of bit line to substrate capacitance.

An ancillary benefit of the staggered layout, when floating gates are disposed at opposed sides of each bit line, is that integrated devices of more homogeneous electrical characteristics (e.g. relatively consistent bit line resistances) can be readily fabricated on a mass production basis. When there is misalignment between a first mask used to define the floating gate pattern and a second mask (photoresist mask) used in combination with the floating gate pattern to define the bit line geometries, such misalignment may increase the resistance of a first bit line segment in the region of a first row by a substantial amount, but the same misalignment will decrease the resistance of a second bit line segment in the region of an opposingly oriented second row by a comparable amount. The simultaneous increase and decrease of segment resistances offset one another so that the total resistance of each bit line becomes substantially insensitive to minor misalignments between the first (floating gate) and second (photoresist) masks. As a consequence of this insensitivity to misalignment (and also as a consequence of reduced bit line length which occurs when the word line pitch is reduced), the electrical characteristics of integrated circuits produced in different fabrication batches may be made more homogeneous, and/or greater manufacturing yield may be obtained.

When bit line resistance is made misalignment insensitive, drawn bit line widths can be reduced to dimensions less than those previously possible. If bit line widths are reduced, the size of PN junctions formed at the interface of the bit lines and the substrate diminishes, bit line-to-substrate capacitance is reduced, and as a result, either the discharge time requirement of the bit lines can be reduced to obtain shorter cell read times, or the minimum level of read current that is needed for a prespecified cell read time can be reduced. If the minimum read current level is reduced, the minimum effective channel width required for conducting such a current is reduced (all other factors being equal). As a consequence, the word line pitch can be reduced to thereby increase packing density even further.

In accordance with another aspect of the invention, word lines are drawn to be narrower than the floating gates at least at portions of the word lines where the word lines cross over the floating gates. When the word lines are made narrower, there is less danger that misalignment between the word line mask and the floating gate mask will enable the word lines to closely overlap regions of the substrate surface which completely link a nondrain/nonsource portion of one bit line to an opposed nondrain/nonsource portion of an adjacent bit line; the nondrain/nonsource portions being those portions of the bit lines that are not intended to serve as either a drain or a source of a memory cell transistor. As a consequence, there is less of a likelihood that the word lines will accidentally induce inversion in the linking regions when misalignment occurs, the design becomes misalignment insensitive, and manufacturing yield can be increased.

In accordance with a further aspect of the invention the thick oxide insulation (field oxide) which straddles the floating gates of previous designs is completely eliminated. This elimination is contrary to accepted practice because it potentially opens the way for excessive leakage current between nonsource and nondrain portions of adjacent bit lines. But the above disclosed structure for obtaining more homogeneous bit line resistances allows designers to shrink their bit line widths. This in turn allows them to lengthen the spacing between facing edges of adjacent bit lines (without having to increase bit line pitch) and thereby allows them to reduce the danger of developing excessive leakage currents (punch-through currents) between nondrain/nonsource portions of facing bit line edges.

Once the field oxide is eliminated, the packing density of the memory array can be increased even more. Floating gate widths can be made smaller than was previously possible because dimensional imprecision considerations arising from the Bird's Beak growth phenomenon are removed. There is no longer any worry that excessive Bird's Beak growth might cut down the effective channel width of the transistors to a value below a required minimum effective channel width. Thus, since the floating gates do not have to be drawn as wide as previously necessary to compensate for the Bird's Beak problem, word line pitch can be decreased and packing density of memory cells in the array can be increased.

Furthermore, the elimination of field oxide in the area of the substrate where the memory cells are formed, obviates concern for misalignment between the field oxide defining mask and the bit line defining masks. Such misalignment had the potential of increasing bit line resistance beyond a design maximum. Elimination of the field oxide eliminates the misalignment problem. Moreover, it allows the substrate to have a substantially planar surface topography. Various lithographic constraints relating to nonplanar lithography are eliminated and smaller design rules associated with isoplanar lithography may be used in their place. As a result, even smaller floating gate widths can be drawn and the memory cells can be shrunk to be packed even closer together.

In accordance with yet another aspect of the invention, the word lines are shaped to each have alternating wide and narrow portions. The probability that a discontinuity in the word lines will result somewhere along their lengths from a so-called "photoresist necking" phenomenon is reduced and, as a result, smaller design rules can be used for the word line widths. The wide portions of a first word line can be fitted in tile like fashion with the narrow portions of an adjacent word line so that spacing between adjacent word lines can be minimized and thus, the impact of the "necking" phenomenon on the pitch of the word lines is reduced.

BRIEF DESCRIPTION OF THE DRAWINGS

FIG. 2B is an enlarged view of a portion of FIG. 2A as it appears in drawn form.

FIG. 2C is a top view of a portion of FIG. 2B as it appears after fabrication.

FIG. 9A is a top plan view of a first embodiment in accordance with the present invention.

DETAILED DESCRIPTION

The following is a detailed description of the best modes presently contemplated for carrying out the invention. It is to be understood that this description is intended to be illustrative only and is not to be taken in a limiting sense. In particular, it is to be understood that exemplary design rule values provided herein are not intended to limit the scope of the invention and that it is well within the contemplation of the invention to use smaller design rules.

Figure 6A:
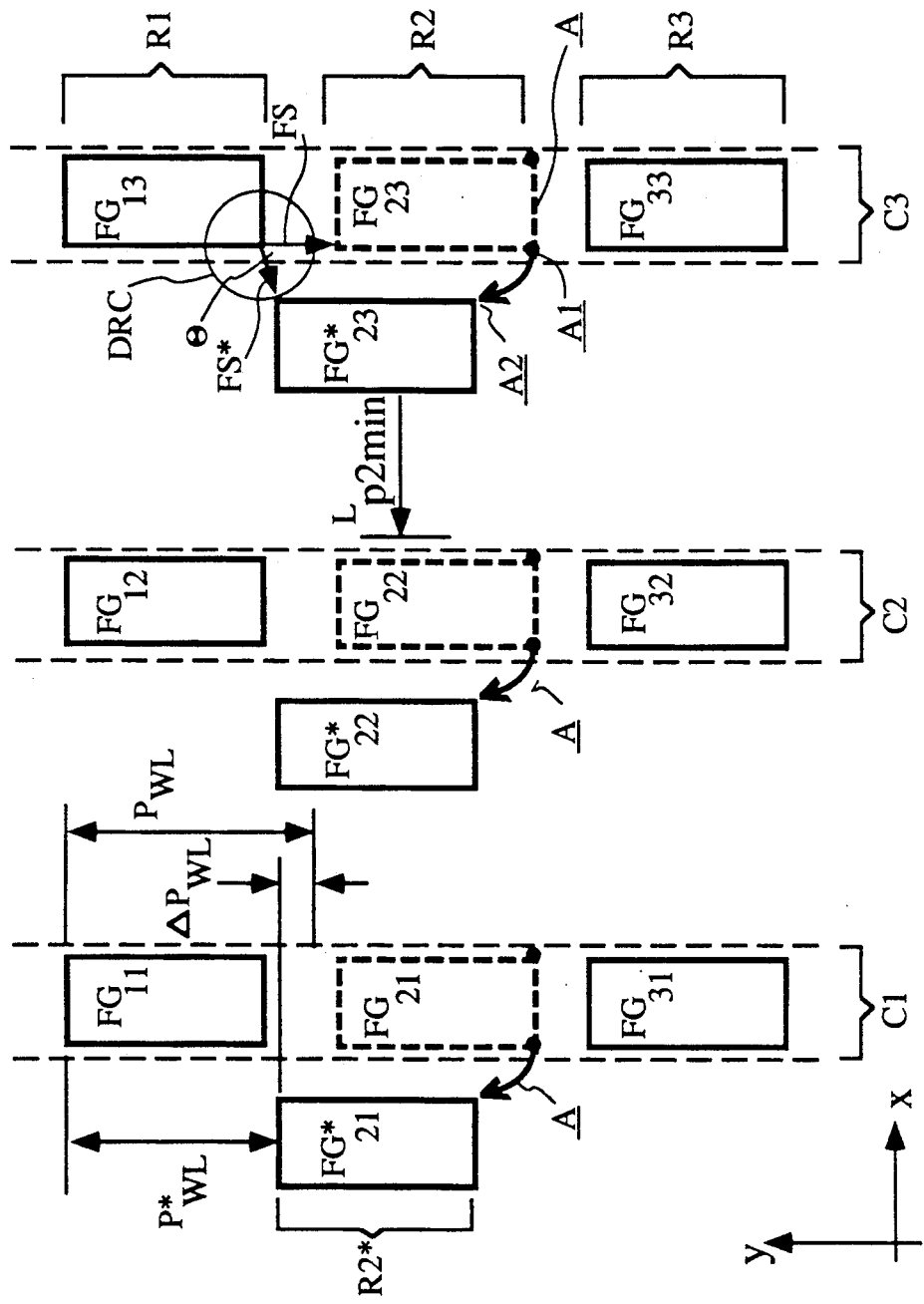
FIG. 6A is a top plan view showing how alternating rows may be staggered in accordance with the invention.

Referring to FIG. 6A, the floating gates of the nonstaggered design (FIG. 2A) where all aligned in linear columns C1, C2, C3, and in linear rows R1, R2, R3. If the floating gates $FG_{21}$, $FG_{22}$, $FG_{23}$ of row R2 were to be shifted to the left, following the path designated as A in FIG. 6A, they will be outside their previous columns C1, C2, C3 at position A1 of the path and an advantage will begin to develop. Minimal distance between the floating gates of rows R1 and R2 will no longer be measured on a flat-portion to flat-portion basis (e.g. between the flat bottom side of $FG_{13}$ and the flat top side of $FG_{23}$) but rather on a corner to corner basis (e.g. between the bottom left corner of $FG_{13}$ and top right corner of $FG_{23}$). The design rule for corner to corner spacing FS*, may be set smaller than the design rule for flat to flat spacing, FS, (e.g. 0.95 micron instead of 1.10 micron) because of the corner rounding phenomenon mentioned earlier (and shown in FIG. 2C). So immediately, the pitch $P_{WL}$* between the staggered second row (now denoted as R2* and FG*$_{21}$, FG*$_{22}$, FG*$_{23}$ to distinguish from that of FIG. 2A), which is measured in the y-direction, can be made smaller than the previous pitch $P_{WL}$. This, however, is only the beginning of the advantages which may be derived from the shifting (staggering) of the second row R2* out of columnar alignment with the first row R1.

If the floating gates of row R2* are now moved along the arched portion of path A beyond point A1 to a second point A2, such that their upper right corners abut against imaginary minimum design rule circles DRC having radii FS* (only one such circle DRC is shown, centered about the left lower corner of $FG_{13}$ for the sake of clarity), the corner to corner spacing vector FS* becomes substantially angled relative to the y direction of the word line pitch $P_{WL}$. The corner to corner spacing is preserved as long the angle $\theta$, by which the vector FS* is rotated out of alignment with the flat-to-flat vector FS, remains in the range between zero and ninety degrees. Preferably the vector FS* is rotated by an angle $\theta$ substantially greater than zero and less than ninety degrees such as in the range between 15 and 75 degrees. The new pitch $P_{WL}$* shrinks even further so that the saving in word line pitch becomes:

$$\Delta P_{WL}=P_{WL}-P_{WL}^{*}=FS-FS^{*}+FS^{*}(1-\cos\theta)$$

The above equation appears to indicate that word line pitch minimization will occur at $\theta=90°$. But there are various limitations which need to be considered. First, assuming that $\theta$ could be arbitrarily increased up to 90°, it will be apparent that as the angle $\theta$ approaches 90°, the inter-floating gate spacing can switch from the corner-to-corner mode, FS*, back to the flat to flat mode, FS, thereby eliminating the advantage of the smaller corner to corner design rule. More importantly, there is a minimum spacing requirement $L_{p2min}$ between the left sides of the floating gates $FG^{*}_{21}$, $FG^{*}_{22}$, $FG^{*}_{23}$ and the bit lines to their left. (The bit lines are not shown in FIG. 7A for the sake of clarity, and for that matter neither are any field oxide portions shown.) The minimum spacing $L_{p2min}$, which is needed for assuring that a control gate portion 14 will form close to the substrate surface in each transistor when the poly 2 layer is deposited and that the control gate portion 14 will have a minimum effective length, will be violated in practical designs well before the $\theta=90°$ point is reached. Such violation tends to occur relatively early in the rotation of the FS* vector if the right to left (drain to source) $L_{p2min}$ orientation of FIG. 6A is employed.

Figure 6B:
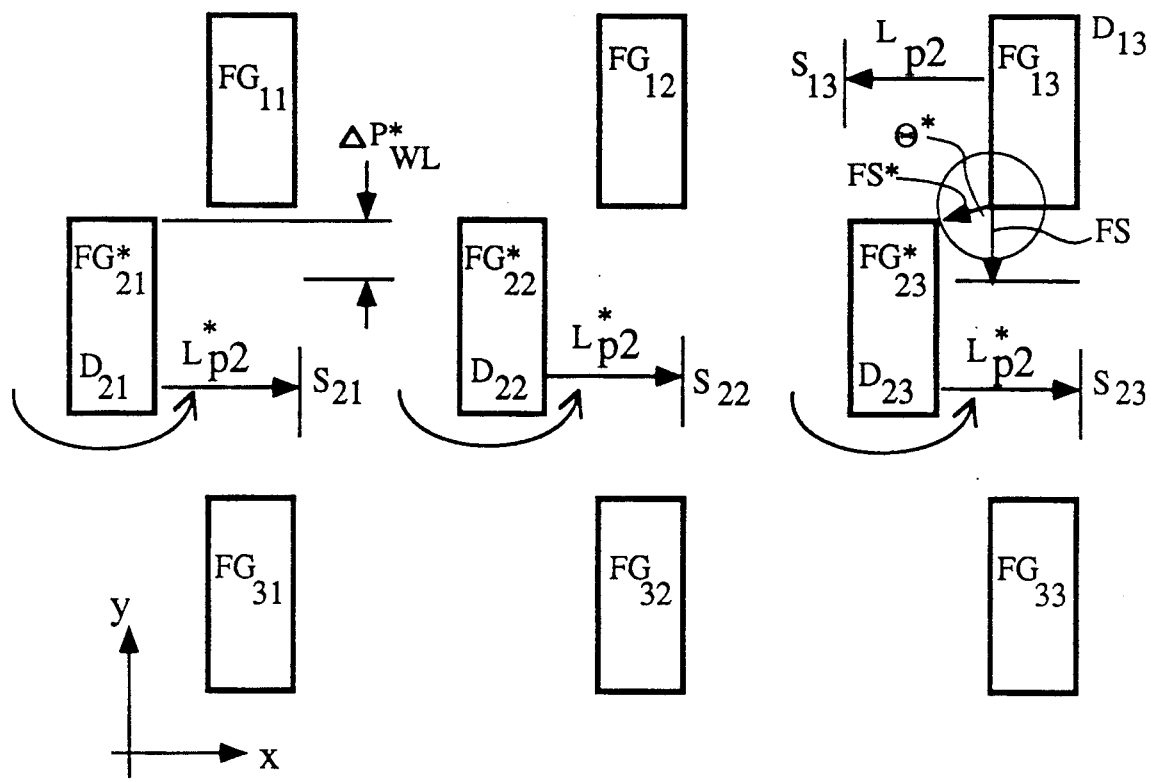
FIG. 6B is a top plan view showing how word line pitch may be reduced by inverting the source to drain orientations of adjacent rows.

FIG. 6B shows how the limitation imposed on the rotation angle $\theta$ of row R2* by the minimum spacing requirement $L_{p2min}$ can be overcome. The drain to source orientation of row R2* is inverted 180° so that the new $L^{*}_{p2min}$ is measured from the right sides of gates in row R2* rather than the left sides. The inverted $L^{*}_{p2min}$ dimension is not restrained by bit lines to the left of the floating gates and this allows for a larger angle of rotation $\theta$*. Usually an angle $\theta$ in the range between 25° and 45°, and more preferably in the neighborhood of 30°-35°, is preferred because of considerations respecting the effect of the angle $\theta$ on the minimum bit line pitch $P_{BL}$ that can be obtained as $\theta$ increases. $P_{BL}$ may be defined as including the components $L_p+FS^{*}\sin\theta^{*}$. The component $FS^{*}\sin\theta^{*}$ increases as the angle $\theta^{*}$ increases in the range 0°-90°.

Once an inverted source-drain orientation is adopted for alternate rows, something remarkable happens. The misalignment sensitivity of the bit lines is reduced. Reference to FIGS. 7A-7D will quickly explain how a previous non-staggered layout of the floating gates creates misalignment sensitivity and reference to FIGS. 8A-8C will explain how misalignment immunity is obtained by the staggered floating gate layout of the invention.

Figure 7A:
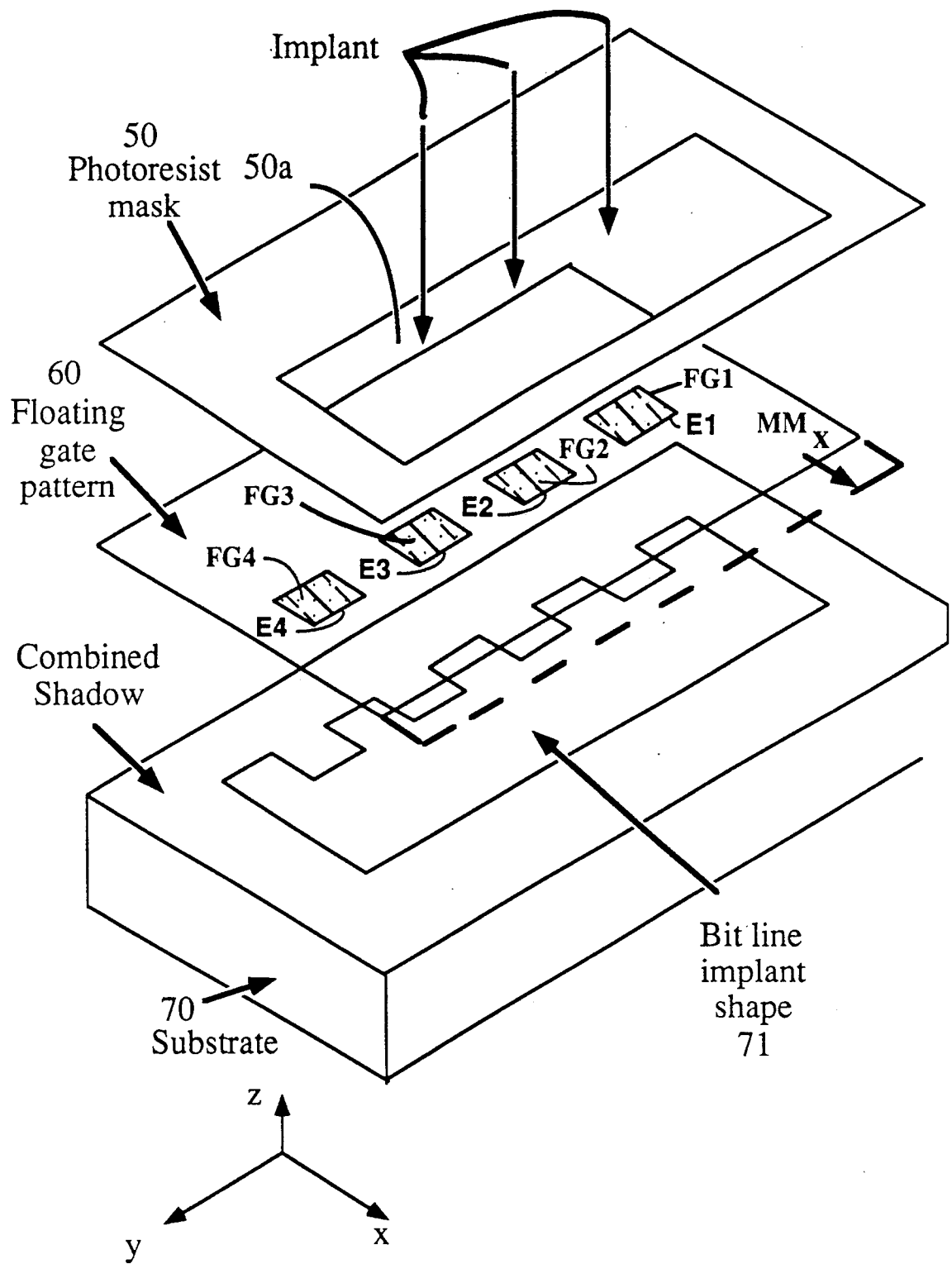
FIG. 7A is an exploded perspective view showing one method by which a floating gate pattern is combined with a photoresist mask to define the bit line implant shape.

In FIG. 7A, a photoresist mask 50 having an implant window 50a defined therein is shown exploded away from a floating gate pattern 60 and a substrate 70 so that the effects of misalignment between the mask 50 and pattern 60 can be visualized. Field oxide portions FO are not shown so that the explanation can be simplified.

The floating gate pattern 60 can be thought of as being capable of shifting in the x direction relative to the photoresist mask 50. Of course, it will be understood from the prior explanations that the floating gate pattern 60 is deposited directly on the substrate 20 and the photoresist mask 50 is deposited directly on the floating gate pattern 60. Edges E1-E4 of floating gates FG1-FG4 protrude into the area of the photoresist window 50a so that they can be used to define drain regions of the to-be-formed split gate transistors and cause those drain regions to be self-aligned to the floating gate. A toothed implant image 71 is cast on the substrate 70 when bit line forming dopants are projected through the photoresist window 50a and past the floating gate pattern 60 into the substrate. The shape of the bit line implant image 71 is, of course, self-aligned to the floating gate edges E1-E4 but more important here, the width of the bit line implant image 71 is determined at the narrowest portions thereof by how much the edges E1-E4 protrude into the area of the implant window 50a and this controls the resistance of the bit lines.

Figure 7B:
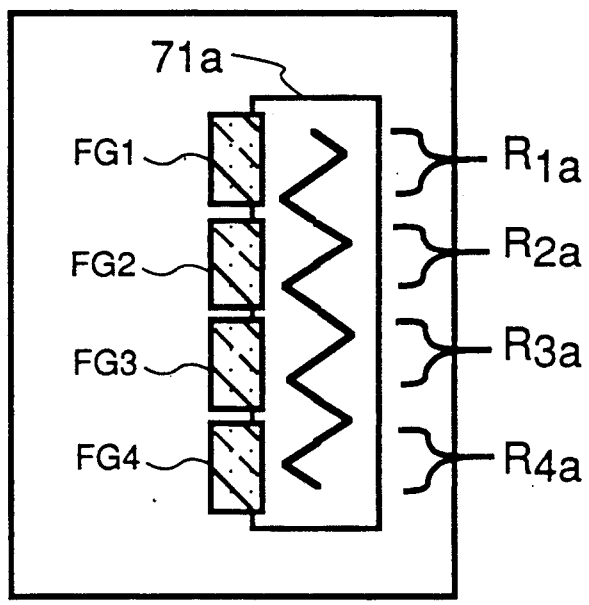
FIG. 7B shows the image of the bit line implant of FIG. 7A when the floating gate pattern is positioned to protrude by a first amount into the area of an implant window defined in the photoresist mask.
Figure 7C:
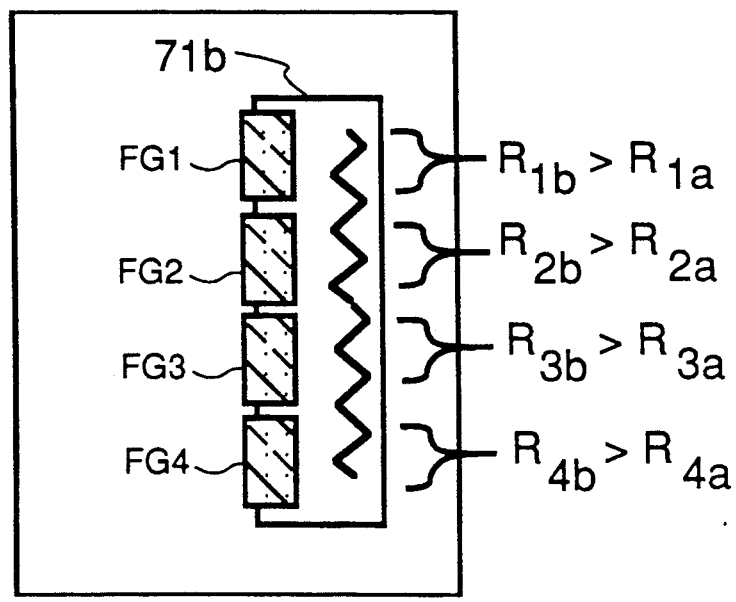
FIG. 7C shows how the bit line image of FIG. 7A can be pinched if the floating gate pattern shifts to protrude by a second amount, further into the area of the photoresist implant window.

As shown in the plan views of FIGS. 7B and 7C, a single bit line region may be viewed as being formed of a plurality of vertical resistance segments R1a, R2a, R3a, R4a respectively belonging to and defined by the bit line defining edges E1 through E4 of respective floating gates FG1-FG4. The resistance of any one segment will be inversely proportional to width of the bit line region at that point. Thus when the bit line image 71 is pinched by shifting the floating gate pattern 60 so that bit line defining edges E1-E4 protrude even further into the area of photoresist window 50a, (as occurs when replacing the configuration of FIG. 7B with the configuration of FIG. 7C) the resistance of each of the corresponding segment resistances will increase. It should be appreciated that the resistance of a bit line segment will increase rapidly towards infinity as the width of that bit line segment approaches zero. Accordingly, even small shifts of the floating gate pattern on the order of say, 0.3 micron, can cause the segment resistances R1b, R2b, R3b and R4b of FIG. 7C to have resistance values significantly greater than the resistances of FIG. 7B, especially when resistive segments $R_{1a}$ through $R_{4a}$ have nominal widths on the order of 0.5 micron or less (when there is no misalignment).

The total bit line resistance $R_S=(R_{1b}+R_{2b}+R_{3b}+R_{4b})$ attributable to the bit line image shown in FIG. 7C is cumulative of the resistance increase in each of its segments. Thus, the bit line pinching effect is aggravated by the number of intermediate transistors disposed along the bit line when viewed from the perspective of the transistor most distal (in the electrical sense) from the contact node of the bit line (e.g. $Q_{1k}$ of FIG. 1). If we consider the general case of a bit line having N floating gates disposed longitudinally therealong between contact nodes (N transistors), the summed resistance change will be generally proportional to the number N so that as one shrinks the dimensions of the bit line image 71 when going from the photoresist-mask 50 versus floating-gate-pattern 60 configuration of FIG. 7B to that of FIG. 7C the magnitude of resistance increase becomes larger as the number N becomes larger. This resistance increase may be defined as a function of not only the number N, but also of a mask-to-mask misalignment $MM_x$ which can develop between the floating gate pattern 60 and the photoresist mask 50.

Figure 7D:
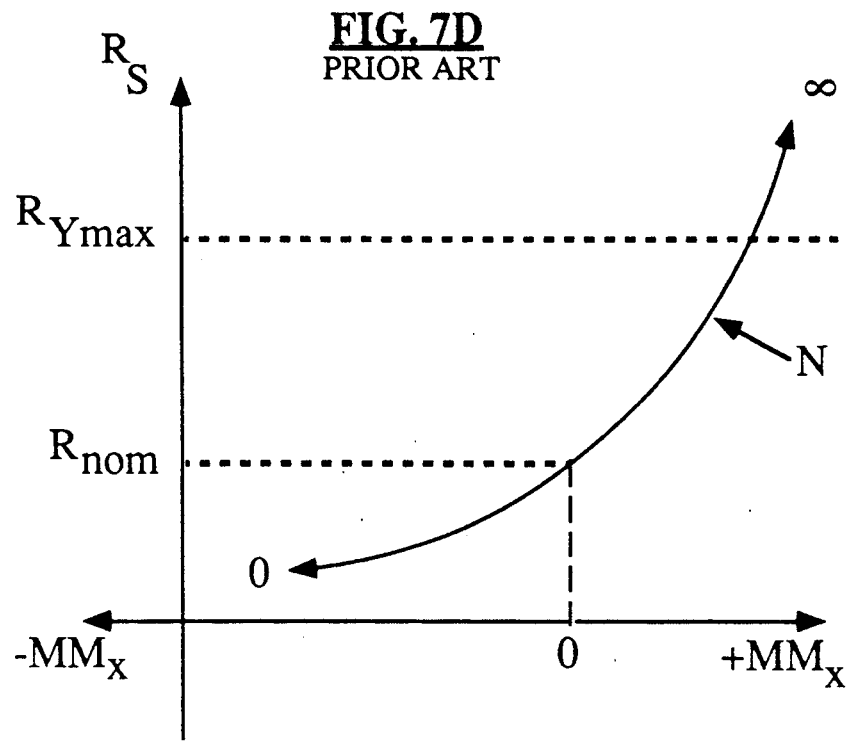
FIG. 7D is a plot of total bit line resistance versus misalignment between the photoresist mask and the floating gate pattern of FIG. 7A.

The relation between mask misalignment $MM_x$ and total bit line resistance $R_s$ is plotted in FIG. 7D. When mask misalignment is zero, the summed bit line resistance $R_s$ is equal to a nominal design value $R_{nom}$. The summed resistance $R_S$ advantageously drops toward zero as misalignment increases in a first direction ($-MM_x$) but that resistance $R_S$ increases disadvantageously so that it can pass beyond a predetermined design limit $R_{Ymax}$ and head toward infinity as mask misalignment $MM_x$ increases in an opposed second direction ($+MM_x$) It is the latter increase of the misalignment $MM_x$ which worries device designers and leads them to drawing bit lines having widths that are larger than would otherwise be necessary.

Figure 8C:
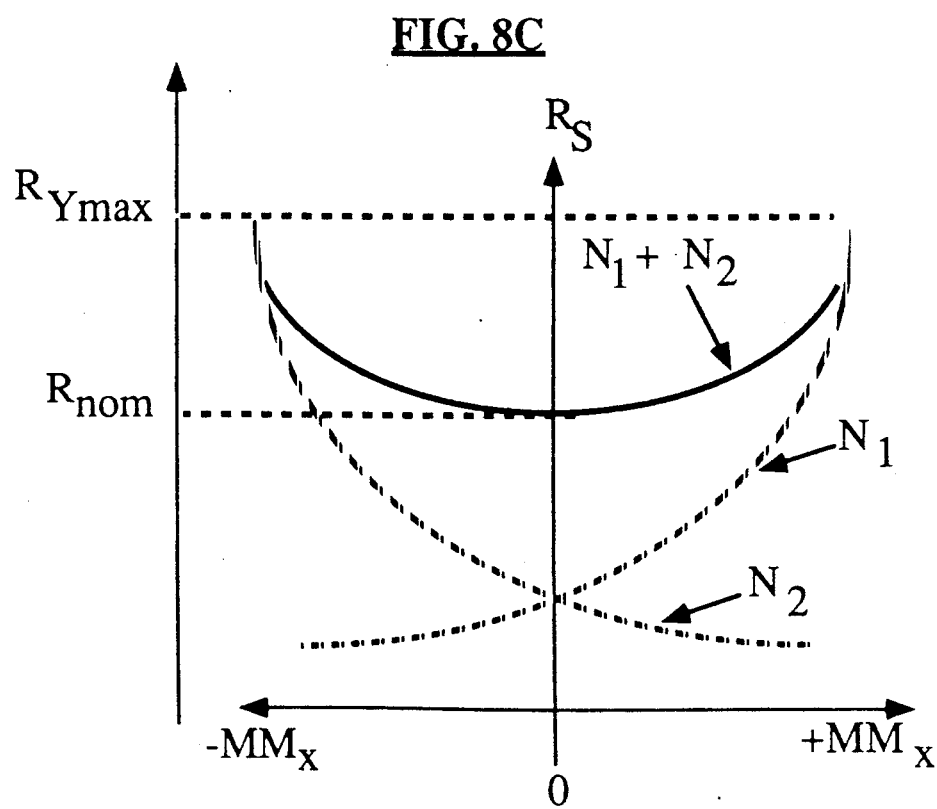
FIG. 8C is a graph showing how the bit line resistance versus misalignment characteristics of opposingly oriented rows may be combined to reduce misalignment sensitivity.
Figure 8A:
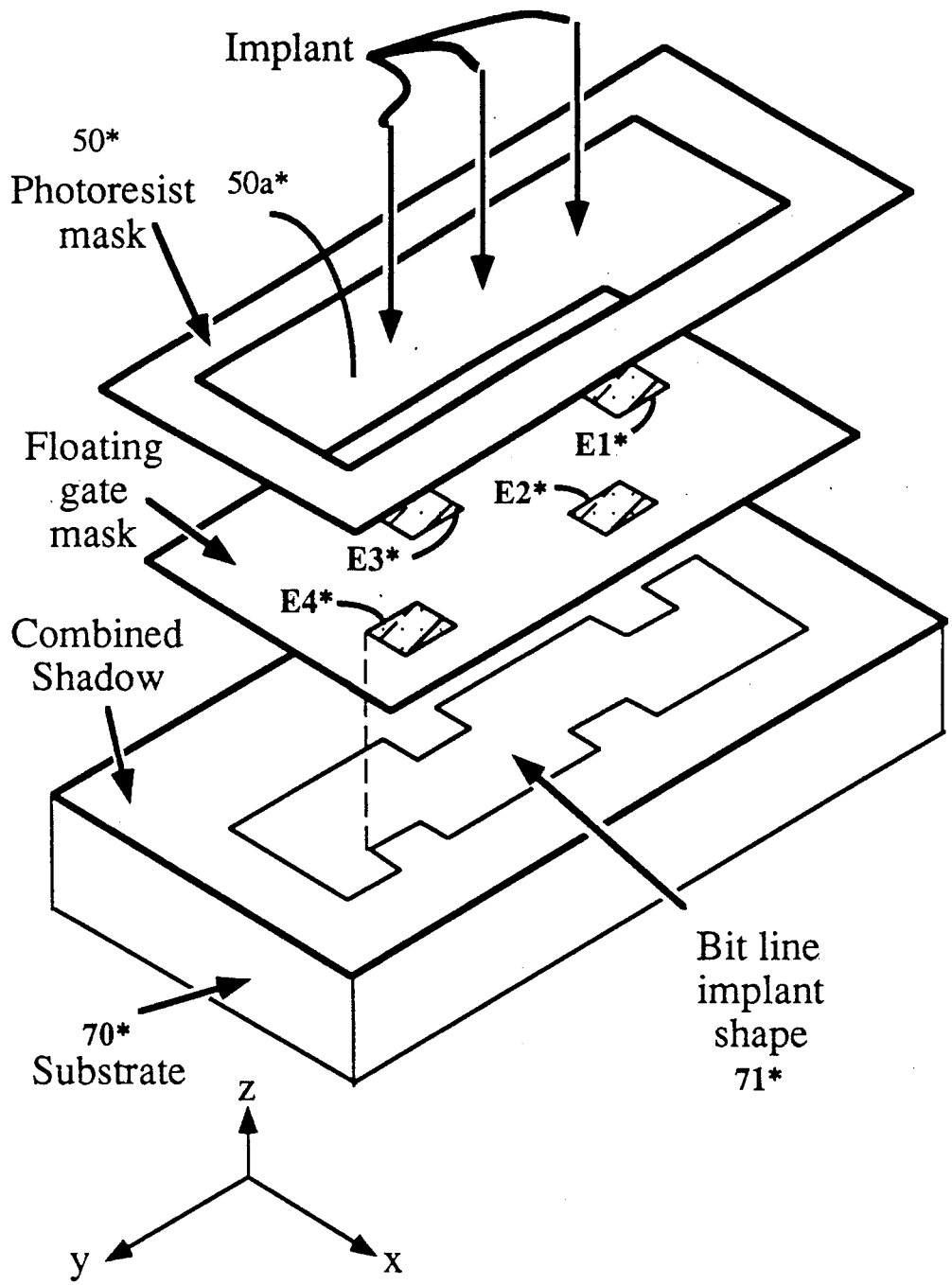
FIGS. 8A and 8B are respectively an exploded perspective view and a plan view showing how misalignment sensitivity can be reduced by staggering floating gates to overlap opposed sides of a bit line in accordance with the invention.
Figure 8B:
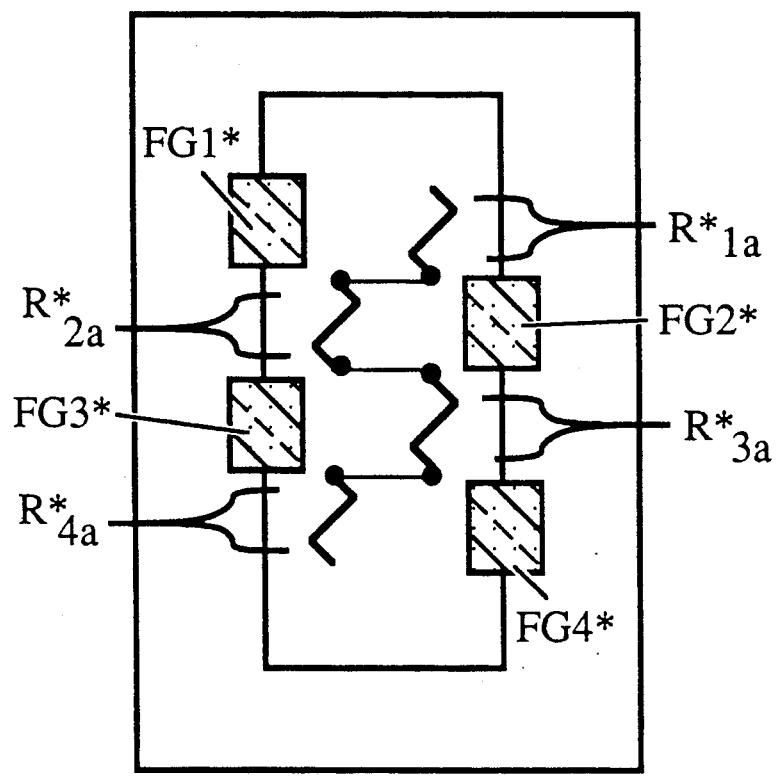

Referring to the staggered floating gate arrangement of FIGS. 8A and 8B, it will be quickly seen that total bit line resistance is substantially less sensitive to mask misalignment than that of the non-staggered layout shown in FIGS. 7A-7C. Pinching of a first bit line segment is offset by expansion of a second bit line segment when the photoresist mask 50* and floating gate pattern 60* are shifted relative to one another. In the plot of FIG. 8C it can be seen that the resistance increase contribution of a firstly oriented set $N_1$ of a total number N of floating gates (when moving in the $+MM_x$ direction) is countered by the resistance decrease contribution of a secondly oriented set $N_2$ of the N floating gates on the same bit line so that total bit line resistance does not change as drastically as it did in FIG. 7D. In FIG. 7D we had N segments simultaneously increasing in resistance when misalignment occurs in direction $+MM_x$. In FIG. 8C we have the same total number of segments $N=N_1+N_2$, but only $N_1$ of the segments are increasing in resistance ($N_1<N$) and furthermore, $N_2$ of the segments are decreasing in resistance when misalignment occurs in direction $+MM_x$. Accordingly, one advantage of the staggered layout is that a larger absolute value of mask misalignment $|MM_x|>0$ can be tolerated before the total bit line resistance reaches and exceeds the design limit $R_{Ymax}$. (This comparison, of course, assumes that the drawn dimensions of the bit lines in FIG. 8A are the same as corresponding dimensions in FIG. 7A.) Alternately, smaller feature dimensions can be tolerated for a fixed value of worst case misalignment. And, of course, various combinations of increased misalignment tolerance and decreased cell dimensions can also be derived using the staggered floating gate pattern of FIG. 8A.

Moreover, the number $N=N_1+N_2$ of transistors associated with each contact node can be increased. In previous designs (e.g., nonstaggered virtual ground configuration) it was found necessary to have no more than 32 floating gates between the sequential contact nodes of a bit line having multiple contact nodes. Since each contact node consumes finite substrate area, the packing density of the previous memory array configuration (nonstaggered virtual ground) taken as a whole tended to suffer as memory capacity was increased and more contact nodes were included. It was found that with the present invention, as many as 48 transistors can be packed between the contact nodes of a single bit line without running into the problem of developing excessive bit line resistances due to misalignment, and as such, the number of contact nodes required for implementing memories of large capacity can be made smaller, and more substrate area can be made available for other functions. By way of example, only 88,000 contacts were needed to design a 4 megabit memory array using the staggered layout of the present invention (mainly because 4,194,304/48 = 87,381). This is with a 1.2 micron line width.

In using the concepts of the present invention, it was found possible to shrink cell size by about 40% (from a previous 17.5 microns$^2$ area per cell of the nonstaggered virtual ground configuration to a new one of about 10 microns$^2$ or less), again using 1.2 micron design rules. One embodiment of the invention features a 3.4 micron pitch $P_{BL}$ for the bit lines (repetition distance from one bit line to the next) and a 2.8 micron pitch $P_{WL}$ for the word lines, resulting in an average cell area of as little as 9.5 microns$^2$ (using a 1.2 micron design rule!).

Even if cell size is not reduced, the staggered floating gate arrangement where floating gates are used to simultaneously define opposed sides of each of the bit lines is nonetheless advantageous because the arrangement causes total bit line resistance to become more homogeneous over process variations (positive or negative $MM_x$) so that devices having more consistent electrical characteristics from one fabrication batch to the next can be readily mass produced.

Figure 6C:
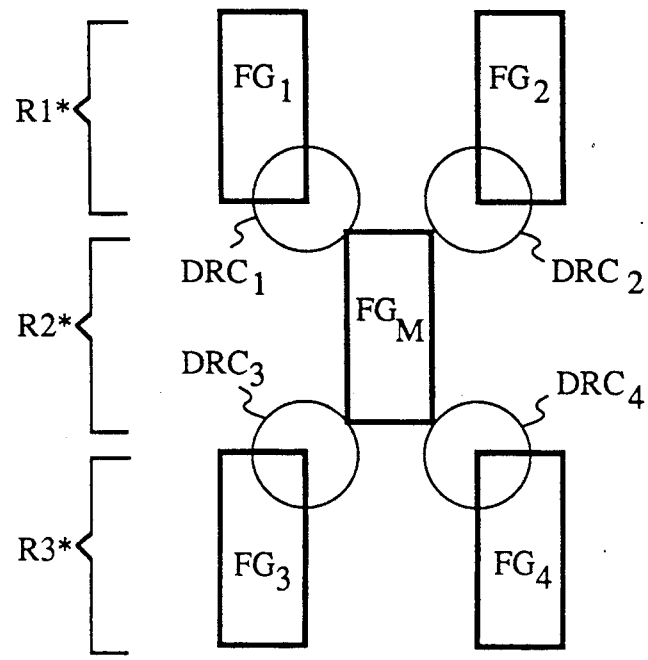
FIG. 6C is a top plan view showing how pitch between floating gates can be optimized in both x and y directions.

Referring to FIG. 6C it will be apparent that pitch can be minimized between the floating gates in both the x and y directions by abutting the four corners of a floating gate $FG_M$ in a middle row R2* against corner centered design rule circles $DRC_1$ through $DRC_4$ of top and bottom rows R1* and R3* as shown. Of course, packing in the x direction has to be tempered by the available patterning techniques for overlying portions of the array. At present, the biggest concern among manufacturers of high density EPROM chips is that design rules associated with the metal lines $ML_1-ML_{k+1}$ prevent the bit line pitch $P_{BL}$ from being reduced to a level comparable with the smaller design rules that are available for miniaturizing other features of the memory array, such as those features that are either implanted into the substrate or patterned in the first few layers above the substrate (e.g., the poly 1 floating gate layer).

Figure 2A:
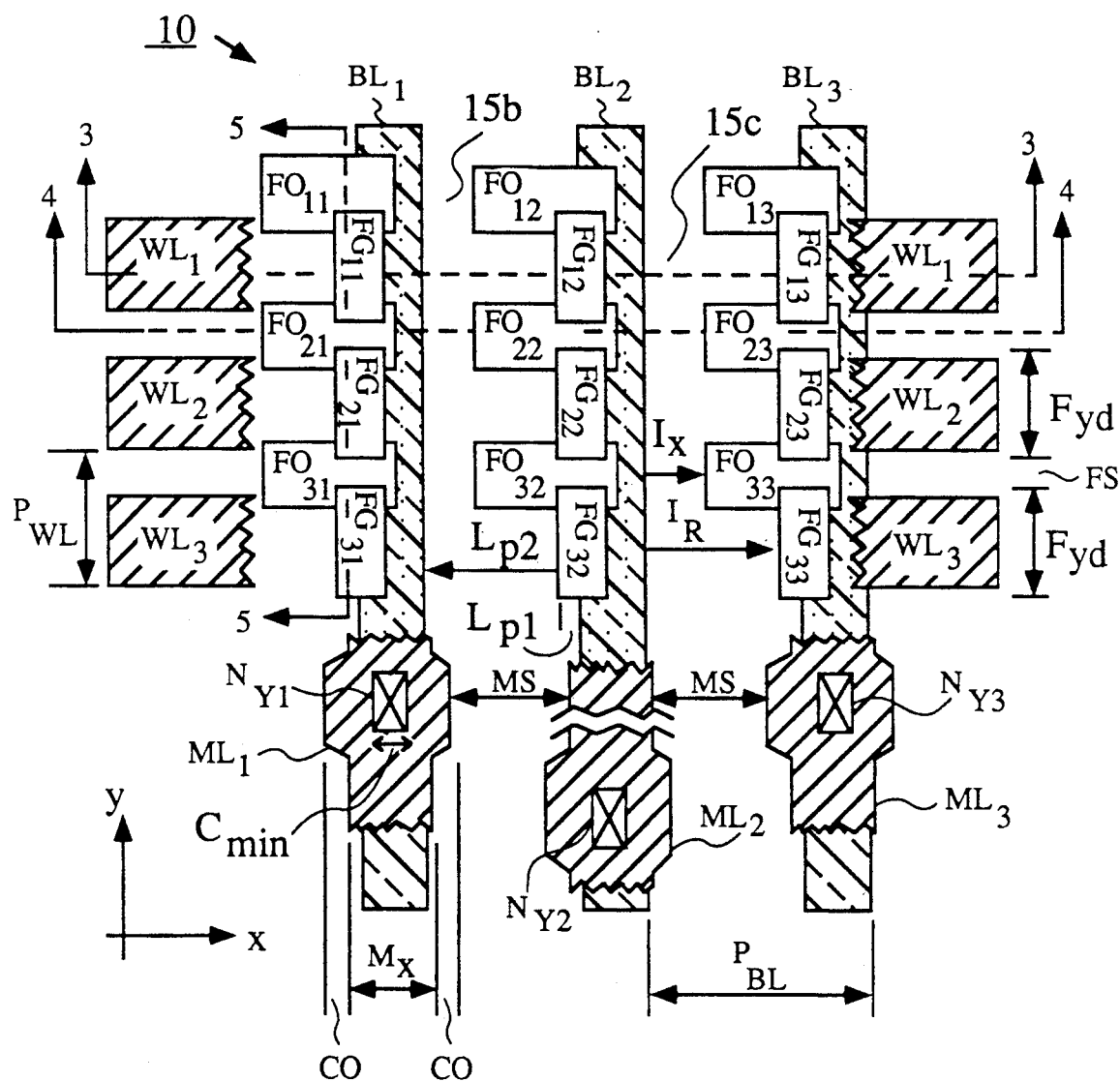
FIG. 2A is a top plan view of a portion of the memory array shown in FIG. 1.
Figure 3:
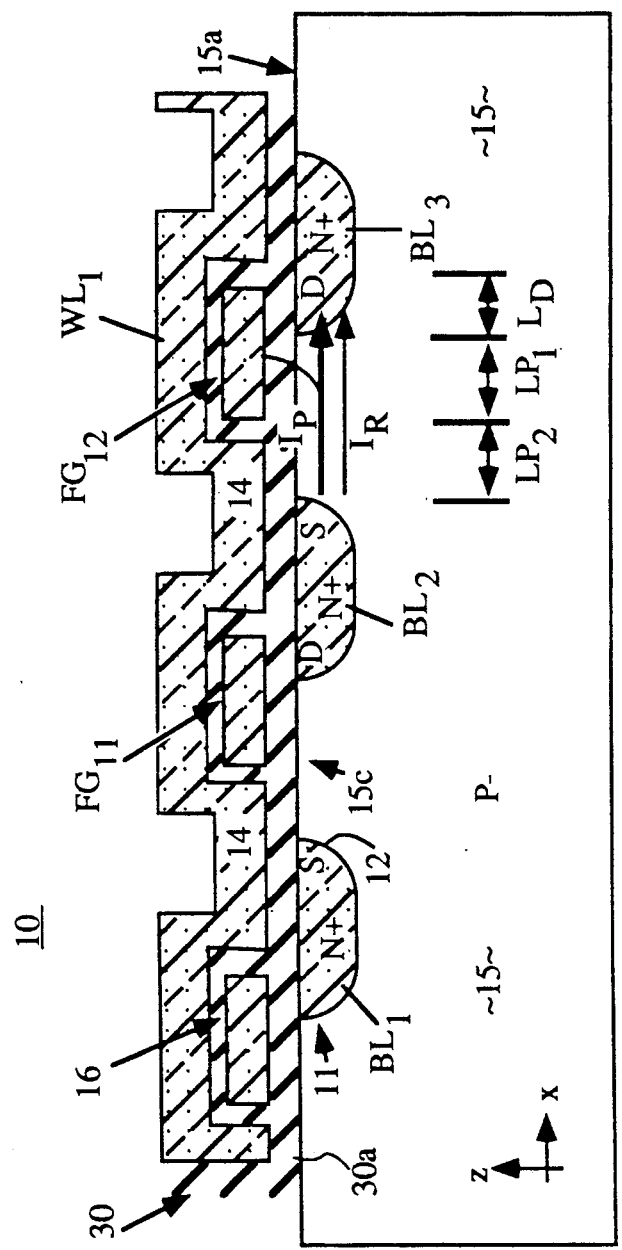
FIG. 3 is a sectional view taken along line 3—3 of FIG. 2A.
Figure 4:
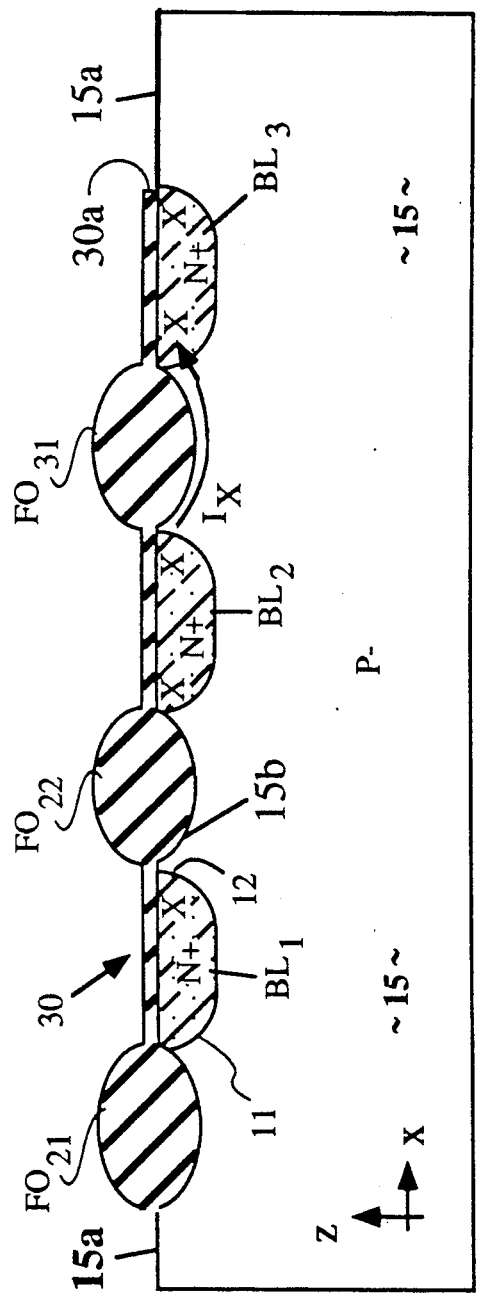
FIG. 4 is a sectional view taken along line 4—4 of FIG. 2A.
Figure 5:
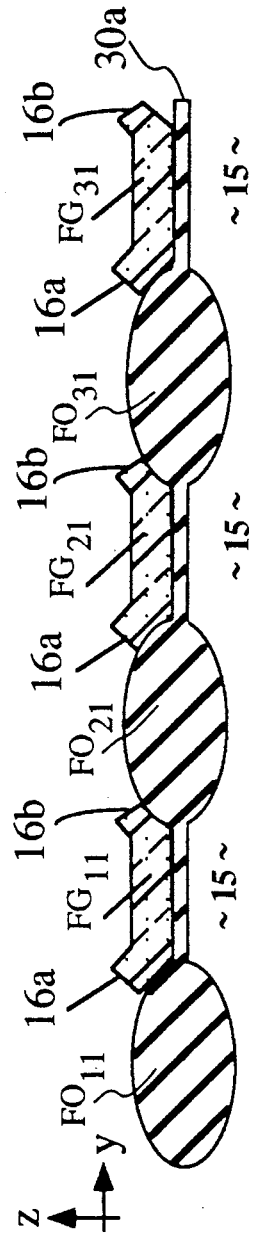
FIG. 5 is a sectional view taken along line 5—5 of FIG. 2A.

The limitations imposed by metal line design rules can be appreciated by referring to FIG. 2A. The contact nodes $NY_1-NY_3$ must have minimum widths $C_{min}$ (which by way of example might be 1.2 micron). The metal lines are usually patterned to have a larger minimum width $M_x$ (of say 1.8 micron to continue with the example). The metal line patterning step which produces metal lines of width $M_x$ is usually required to have a comparably sized minimum intermetal spacing dimension MS (of say 1.4 micron). To prevent misalignment problems, contact overlap portions having a minimum dimension CO (of say 0.2 microns each) will usually be formed on the sides of the minimum metal widths $M_X$ in the regions where the metal lines are to overlap the contact nodes. For the configuration shown in FIG. 2A, these design dimensions force a minimum bit line pitch defined by $P_{BL} \geq CO+M_x+MS$. (Using the $0.2\mu$, $1.8\mu$ and $1.4\mu$ values of our example for CO, $M_x$ and MS this adds up to a minimum bit line pitch $P_{BL}$ of 3.4 microns). The floating gates of FIG. 6C cannot be packed so close in the x-direction that the minimum pitch requirement of the metal rules is violated Also the values of the transistor overlap lengths $L_{p1}$, $L_{p2}$ and $L_D$ have to be considered as limitations on how closely the floating gates can be packed.

One not so obvious outcome of the staggered configuration is that leakage current between adjacent bit lines can be limited to an acceptable level, and as a result, the field oxide portions can be eliminated. If the width of the bit lines is reduced but the repetition distance (pitch) of the bit lines is unchanged, spacing between facing edges of adjacent bit lines increases. By way of example, spacing between facing bit line edges can be increased by 0.4 micron for a bit line width reduction of the same 0.4 micron. Leakage current $I_x$ through the lightly doped inter-channel regions between the spaced apart bit line edges decreases as the spacing between the bit line edges increases. The need for oxide isolation between the bit lines is therefore diminished when the bit line widths are narrowed and the thick field oxide portions FO can be eliminated from the design if desired.

When the bit line widths are reduced (in combination with or independently of the reduction of the bit line lengths), the size of PN junctions formed at the interface of the bit line dopants (N type) with the substrate (P type) shrinks and bit line to substrate capacitance is accordingly reduced. This permits either a faster cell reading time because the charge/discharge time of the PN junctions is reduced, or alternatively, a lower minimum read current requirement. Minimum read current is proportional to bit line capacitance:

$$I_{Rmin} = \Delta V_{sense} C_{bit\ line}/\Delta t_{sense}.$$

In the equation, $\Delta V_{sense}$ is a predetermined voltage swing, $C_{bit\ line}$ is the bit line to substrate capacitance and $\Delta t_{sense}$ is a predetermined time window for detecting the voltage swing. If $I_{Rmin}$ can be reduced by virtue of a reduction in $C_{bit\ line}$, then the minimum effective channel width $W_{min}$ can be reduced. This is because $W_{min}$ decreases as $I_{Rmin}$ decreases. Such a decrease in the minimum channel width $W_{min}$ allows for a smaller overall drawn floating gate width $F_{yd}^*$ and enables a smaller word line pitch, $$P_{WL}^* = F_{yd}^* + FS^*.$$

FIG. 9A is a top plan view of a memory array 100 in accordance with the invention. Asterisks are used to differentiate between portions of FIG. 2A that are similarly referenced. It should be noted that floating gate $FG_{11}^*$ partially overlaps the left side of bit line $BL_2^*$ while floating gate $FG_{22}^*$ partially overlaps the right side of bit line $BL_2^*$. It should be further noted that the drain portion $D_{21}^*$ of transistor $Q_{21}^*$ (not referenced in FIG. 9A but obviously belonging to gate $FG_{21}^*$) is not longitudinally aligned along the left side of bit line $BL_2$ with drain $D_{11}^*$ (of gate $FG_{11}^*$), but rather diagonally disposed at the right side of bit line $BL_1^*$ so that minimum separation distance $FS^*$ between floating gates $FG_{21}^*$ and $FG_{11}^*$ is measured corner to corner and at an angle to the y axis. There are no thick oxide portions FO in the array 100. The word lines $WL_1^*$ and $WL_2^*$ are dimensioned to be substantially narrower than the post-fabrication y-dimension $F_{yp}^*$ of the floating gates ($W_{yp}^* < F_{yp}^*$). The actual width difference, $F_{yp}^* - W_{yp}^*$, is exaggerated in FIG. 9A for emphasis. Normally the difference will be less than approximately 33% of the floating gate width $F_{yp}^*$ (e.g., $F_{yp}^* = 1.9$ micron and $W_{yp}^* = 1.4$ micron). The omission of the field oxide portions FO is better seen in the cross sectional view of FIG. 9C taken along line 9C-9C of FIG. 9A. All bottom surface portions of the floating gates $FG^*$ are uniformly spaced apart no more than 500 Å and preferably no more than 250-300 Å away from the substrate surface. The effective channel width $W_p$ of the floating gates is therefore essentially equal to the post fabrication dimension $F_{yp}^*$. It was by using the techniques of removing the field oxide and forcing the word lines to be narrower than the floating gates, in combination with the staggering of the floating gates, that we were able to reduce the word line pitch, and achieve cell sizes as small as 9.5 microns$^2$ while using design rules as large as 1.2 micron.

Current calculations indicate that the new cell area $A_{cell}^*$ can be safely shrunk to be 15%-20% smaller than the old cell area $A_{cell}$ without removing the field oxide portions, changing any of the lithography rules or altering the misalignment constraints. The cell size can be shrunk even further once the field oxide is eliminated because the Bird's Beak problem is removed. A bit line pitch equal to or less than 3.5 microns and a word line pitch equal to or less than 3.0 microns can be realized even while the design rule is constrained to line widths of 1 micron or greater (e.g. 1.2 micron).

Instead of inhibiting the development of cross current $I_x$ with an oxide isolation technique, the pre-fabrication (not shown) word line widths $W_{yd}^*$ are preferably drawn substantially narrower than the floating gate widths $F_{yd}^*$, at least at regions of the word lines where the word lines pass over the floating gates. Minor misalignment of the word line defining mask relative to the floating gate patterning mask (in the y-direction) is compensated for by the fact that the floating gates now have post-fabrication widths $F_{yp}^*$ substantially wider than the post-fabrication word line widths $W_{yp}^*$ (e.g., approximately 0.3 microns wider on each side). Electrons that pass through the effective channel widths of the control gates (word lines) are assuredly funneled into channel regions that are under control of the floating gates even when misalignment occurs.

Figure 9B:
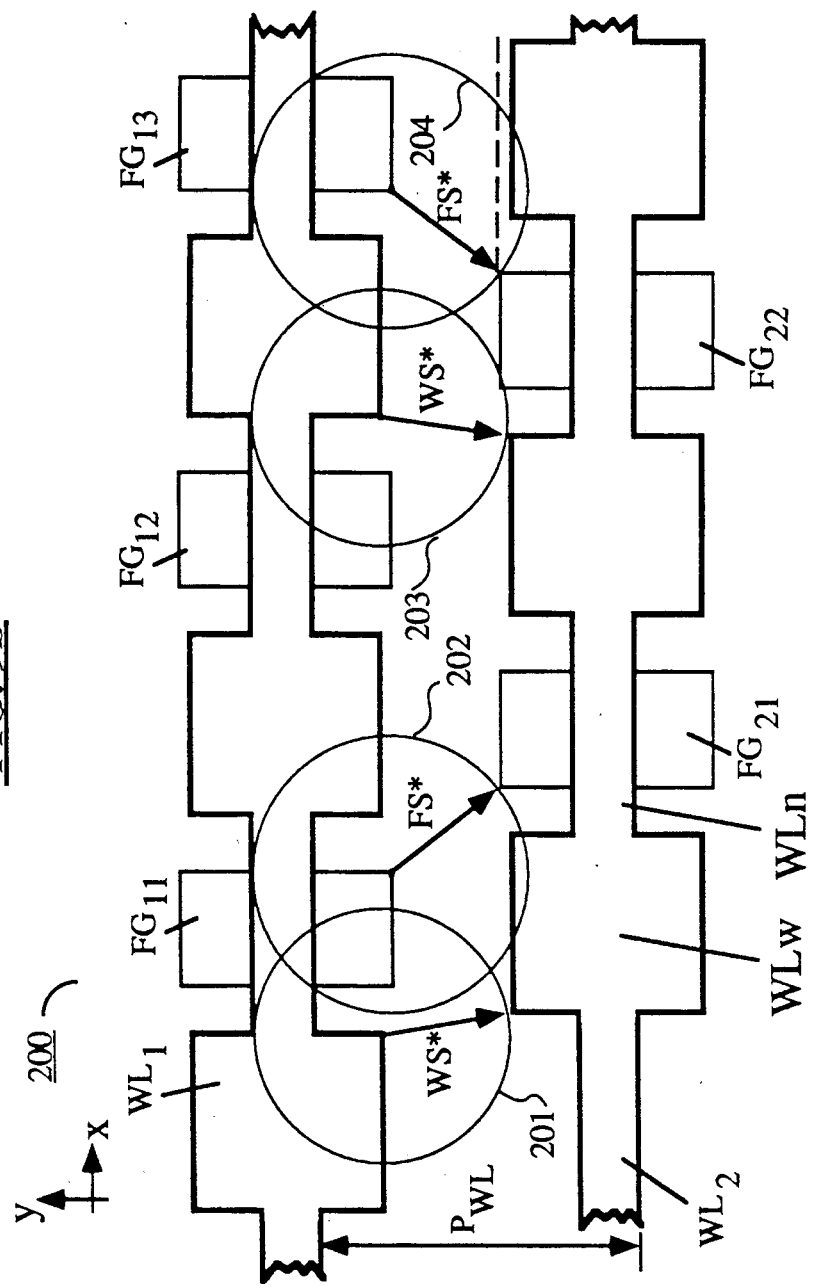
FIG. 9B is a top plan view of a second embodiment showing how spacing between the corners of staggered floating gates and spacing between the corners of word lines having alternating wide and narrow portions may be arranged to meet minimum design rules while allowing the pitch of the word lines to be less than the minimum spacing rules.

Referring to the embodiment 200 shown in the top plan view of FIG. 9B, it can be seen that the word lines WL do not have to be uniformly narrower along their entire lengths. The word lines WL can be made substantially narrower just at the regions WLn where they pass over the floating gates FG. The difference in width between the narrow regions WLn and wide regions WLw is exaggerated in FIG. 9B. Normally, a small difference in width will suffice, such as 0.5 micron where the widths of regions WLn and WLw are respectively 1.4 micron and 1.9 micron. In the case where the word lines are of a constant narrow width as shown in FIG. 9A, it should be noted that the reduced effective channel width under the control gate portions of transistors in FIG. 9A does not significantly diminish read current magnitudes $I_R$ through the transistors. The potential on the floating gates is usually the overriding factor. It will be seen that alternate widening and narrowing of the word lines along their lengths can be used to overcome a "necking" problem that is to be described later.

Figure 9C:
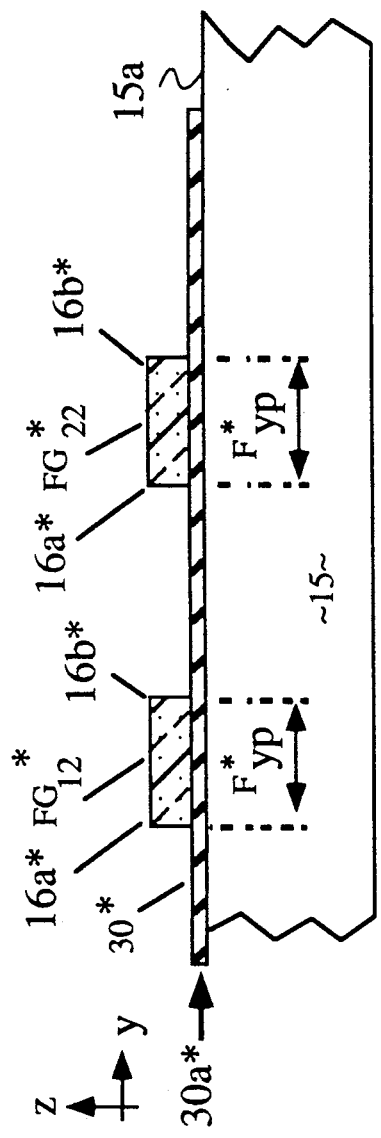
FIG. 9C is a cross sectional view taken along line 9C—9C of FIG. 9A.

Referring to FIG. 9C, since there is no Bird's Beak formation to lift edge portions $16a^*$, $16b^*$ of the floating gates $FG^*_{12}$, $FG^*_{22}$ away from the substrate surface $15a^*$ when the field oxide portions are removed, the effective width $W_{eff}^*$ of the floating gates (that portion of each floating gate having points close enough to the substrate surface, e.g., on the order of 500 Å or less, to substantially control inversion in the underlying substrate) becomes essentially equal to the drawn width $F_{yd}^*$ of the floating gates less the etch shrinkage.

When the field oxide is removed, the problem of misalignment between a field oxide patterning step and a bit line patterning step is eliminated. Previously the bit line dimension $B_{xpo}$ was affected by oxide growth and mask misalignment. With the field oxide gone, the total bit line resistance is no longer a function of oxide pattern to floating gate pattern misalignment, and consequently, mass production of devices having more homogeneous characteristics is made possible.

Elimination of the field oxide portions allows the substrate surface $15a^*$ to have a substantially planar topography. When field oxide was included in previous designs it could produce surface depressions of 2500 Å or greater below the major plane of the substrate surface (i.e. with 5000 Å thick field oxide) and this complicated subsequent lithographic steps. Once the field oxide is gone, the substrate surface $15a^*$ becomes substantially planar and design rules can be relaxed. With respect to the ideal planar shape of the floating gates shown in FIG. 9C, it should be appreciated that edges $16a^*$, $16b^*$ might lift slightly away from the substrate (say, by less than 100 Angstroms) when the oxide insulation for separating the word lines from the floating gates is thermally grown but this usually does not reduce the effective width of the floating gates substantially.

Figure 1:
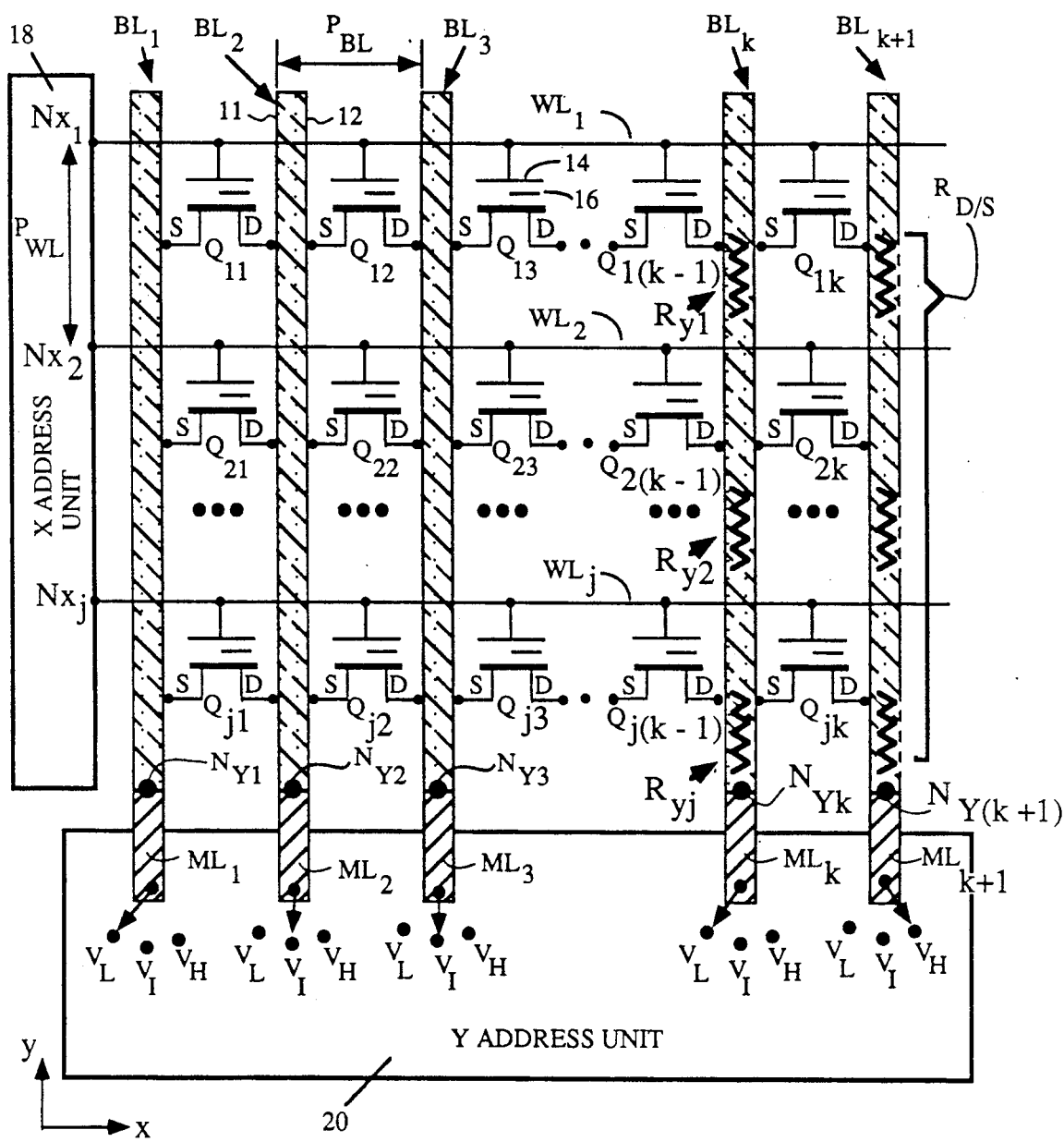
FIG. 1 is a schematic of a virtual ground memory array composed of split gate transistors.
Figure 10:
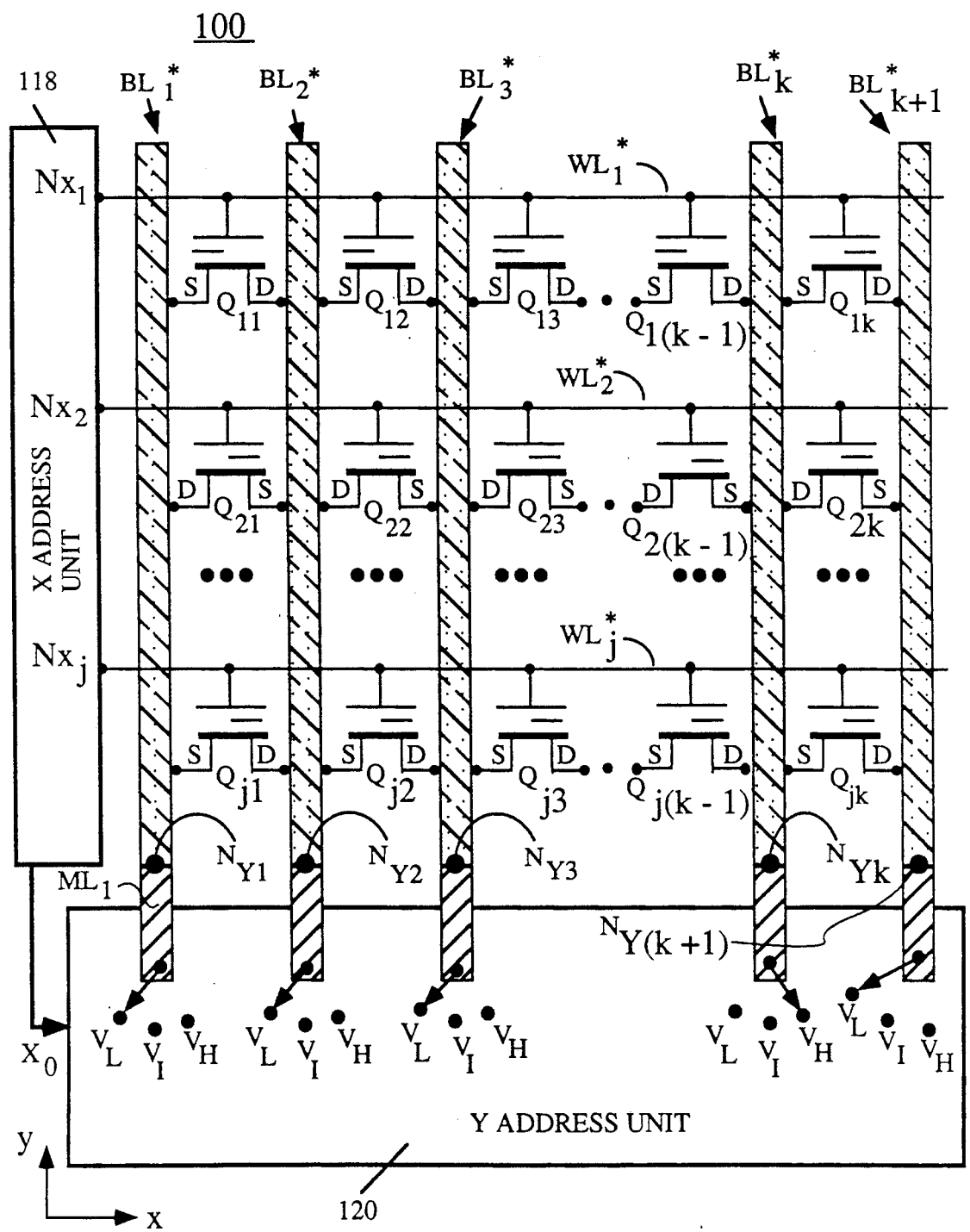
FIG. 10 is a schematic diagram of a memory array in accordance with the invention.

FIG. 10 is a schematic diagram having reference numerals similar to those of FIG. 1, which illustrates a memory array 100' in accordance with the present invention. It should be noted that the drain to source orientations of adjacent rows are opposed. This means that the X-address unit 118 may have to share at least one address line $X_o$ with the Y-address unit 120 so that the latter unit 120 can determine which of nodes $N_{Y1}$ to $N_{Y(k+1)}$ is driving a drain and which is driving a source of a transistor in a selected row. In the illustrated circuit 100', the Y-address unit 120 sets its node voltages differently depending on whether an odd or even numbered row is selected.

Figure 11:
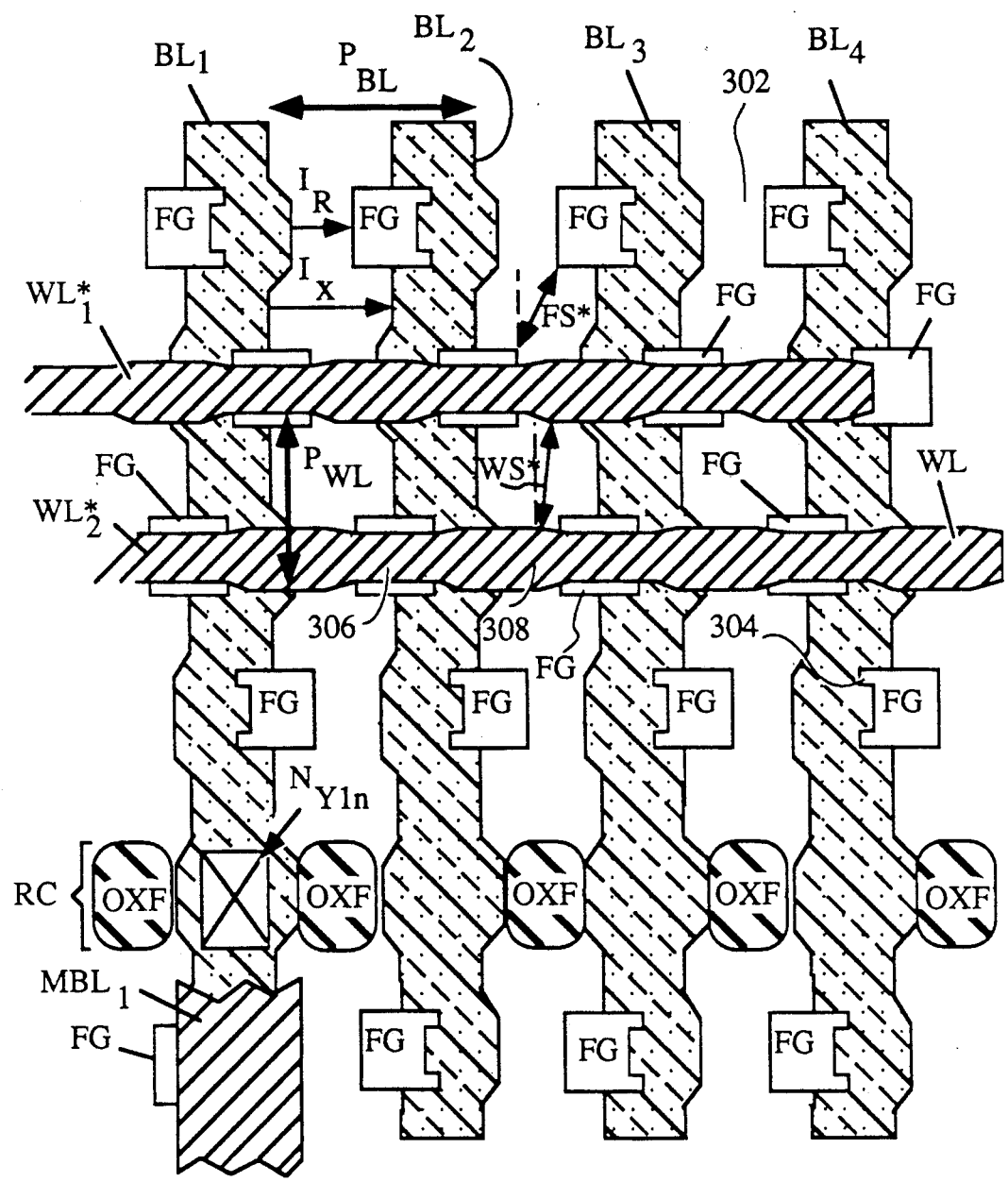
FIG. 11 is a top plan view of a memory array comprised of word lines having wide and narrow portions, where the word lines are tiled to minimize word line pitch.

FIG. 11 is a top plan view of an embodiment 300 in accordance with the present invention. The embodiment 300 comprises plural word lines $WL^*_1$, $WL^*_2$ each having alternating wide and narrow portions. The wide portions 308 of a first word line $WL^*_1$ are arranged to fit in tile like (or puzzle piece like) fashion with the narrow portions 306 of an adjacent second word line $WL^*_2$ so that word line pitch $P^*_{WL}$ can be minimized. Because the minimum interfeature spacing $WS^*$ of the word line patterning step is measured corner to corner and at an angle relative to the word line pitch $P^*_{WL}$, the word line pitch $P^*_{WL}$ can be made smaller than would otherwise be possible if the minimum interfeature distance $WS^*$ were measured flat to flat and along a line parallel to the measure line of the word line pitch.

This aspect of the invention can be better understood by referring back to FIG. 9B. It can be seen in the embodiment 200 of FIG. 9B that not only is the corner-to-corner spacing $FS^*$ of staggered floating gates measured at an angle relative to the pitch (y-axis) of longitudinally adjacent floating gates but that the corner-to-corner spacing $WS^*$ of longitudinally adjacent word lines is also measured at an angle to the pitch $P_{WL}^*$ of the word lines. Four design rule circles, 201–204, are drawn to center around each of the left and right bottom corners of the floating gates and wide word line portions to demark the loci of preselected minimum spacing rules, $FS^*$ and $WS^*$, respectively belonging to the floating gate and word line patterning steps. Word line pitch $P_{WL}^*$ can be minimized by changing the dimensions of the floating gates and the wide word line regions WLw while causing the corners of those portions to abut against the perimeters of their corresponding design rule circles 201–204.

A manufacturing benefit arises from using the alternating wide and narrow portions design of the word lines, as shown in FIGS. 9B and 11. The impact of a so-called "photoresist necking" problem is reduced. When the word lines are manufactured in mass production fashion, a probability exists that somewhere along their length there will develop an excessively pinched portion or a complete discontinuity. The probability is directly related to the length of word line portions and inversely related to their widths. The insertion of alternate wide portions between narrow portions of the word lines reduces the total length of the narrow portions and accordingly reduces the probability that "necking" will occur. This gives designers the options of improving manufacturing yield and/or reducing the width of the narrower word line portions.

In FIG. 11, a metal bit line $MBL_1$ is shown overlying bit line $BL_1$. A metal line to diffused bit line coupling node (via) $N_{Y1n}$ is also illustrated. Every so many transistors down each bit line, say every 48 transistors, a row RC which could otherwise contain memory cells is instead used for providing contact nodes, i.e., $N_{Y1n}$ As more contact node rows RC are used, less substrate area is available for implementing memory cells and, hence, the overall memory density of a memory chip with finite surface area, suffers. If the bit line resistance is kept small in accordance with the methods disclosed herein, more transistors can be placed between contact rows, fewer contact rows RC are needed and the overall memory density of the chip can be increased.

The bit lines, $BL_1$ to $BL_4$, of FIG. 11 have zig-zag shapes so that the distance of travel for leakage current $I_x$ is maximized while the distance for read current $I_R$ is made as small as possible. The word lines $WL^*_1$ and $WL^*_2$ each have alternating wide and narrow portions, 308 and 306, which are fitted next to opposed narrow and wide portions of the other in tile-like (or puzzle-piece-like) fashion along the contact row so that the word line pitch $P_{WL}$ can be minimized. Contact rows RC are repeated once every 12 rows of transistors but only one contact via i.e. $N_{Y1n}$, is provided along each contact row RC for every four bit lines of that row RC. Accordingly, the actual spacing between the contact nodes of each bit line is still 48 transistors but maximum source to contact node resistances and maximum drain to contact node resistances alternate in staggered fashion along the y direction. An advantage is realized because transistors having their source regions midway between nodes of a first bit line are not simultaneously penalized with having their drain regions midway between the contact nodes of the adjacent second bit line. Field oxide portions OXF are used to isolate adjacent bit line portions disposed along the contact rows RC.

FIG. 11 illustrates the layout in drawn form. It can be seen in FIG. 11 that the floating gates FG are drawn to have ear portions 304 extending into the drawn bit line shapes $BL_1$–$BL_4$. Upon plasma etching, these ear portions 304 tend to become square corners so that after fabrication, the floating gates FG will have substantially rectangular shapes at least at portions thereof overlying the bit lines. It can be seen that the narrow portions 306 of the word lines overlie the floating gates of the embodiment 300 while the wide portions 308 overlie protruding portions 301 of the bit lines. While not shown in FIG. 11, it should be understood that during fabrication, zig-zag shaped photoresist strips are laid over the white areas 302 of FIG. 11 to define the word-line controlled channel regions interposed between the zigzagging bit line patterns $BL_1$-$BL_4$.

Numerous modifications and variations will, of course, become apparent to those skilled in the art once the spirit of the present invention is understood. For example, materials other than monocrystalline silicon, polycrystalline silicon and silicon dioxide might be used to form the various substrate, word line and insulation portions of the disclosed memory array (i.e., $Si_3N_4$ for insulation); opposingly oriented rows of floating gates might be grouped in bunches to produce misalignment insensitivity rather than being interleaved one after the next as preferred here; and the disclosed preferential narrowing of word lines relative to the floating gate widths, in combination with elimination of the field oxide portions, may be selected independently of the staggered floating gate configuration. The scope of the invention should therefore not be limited to the specific embodiments described above but rather defined to encompass at least the subject matter of the following claims.

We claim:

1. An array of erasably programmable read only memory cells (EPROM array) comprising:
    a substrate;
    a first diffused bit line defined in the substrate to extend in a longitudinal direction, the first diffused bit line having a left edge and an opposed right edge;
    first, second and third rows of split gate transistors defined on the substrate, each row of transistors extending in a lateral direction to cross over the first diffused bit line, each split gate transistor including a floating gate,
    wherein the second row is interposed between the first and third rows, and the second row is staggered with respect to the first and third rows such that floating gates of the transistors in the second row are not in columnar alignment with floating gates of the transistors in the first and third rows, and
    wherein a first floating gate, within the first row, overlaps a first right edge portion of the first diffused bit line and a second floating gate, within the second row, overlaps a first left edge portion of the diffused bit line.

2. The array of claim 1 wherein:
    the second row is adjacent to at least one of the first and third rows;
    each of the floating gates in the first, second and third rows includes corner portions; and
    minimal distance between the second floating gate in the second row and a nearest floating gate in an adjacent one of the first and third rows is measured along a hypothetical corner to corner line which extends between adjacent corner portions of the second floating gate and the nearest floating gate at an angle relative to a hypothetical row-edge to row-edge line, the hypothetical row-edge to row-edge line extending in the longitudinal direction between adjacent edges of the second row and the adjacent one row, said angle being greater than zero degrees.

3. The array of claim 2 wherein the angle is in the range 15 degrees to 75 degrees.

4. An array of erasably programmable read only memory cells (EPROM array) comprising:
    a semiconductor substrate having portions of said memory cells formed therein, each memory cell of the array including a self-aligned split gate single transistor having:
    (a) a source region;
    (b) a drain region;
    (c) a channel region separating the drain region from the source region;
    (d) a floating gate formed over but insulated from a first portion of the channel region, a first edge of the floating edge being aligned with and used to define one edge of said drain region and a second edge of said floating gate being formed simultaneously with the first edge so as to be positioned a predetermined distance away from said first edge and to lie over said channel region such that it is separated from the closest edge of said source region by a second portion of said channel region; and
    (e) a control gate formed over but insulated from said second portion of said channel region;
    wherein the array further comprises:
    plural bit line regions defined in the substrate to extend longitudinally such that each bit line has laterally opposed first and second sides, the first and second sides include drain portions, drain portions of the first side of each bit line region serve as the drain regions of a first set of split gate transistors, and drain portions of the second side of each bit line region serve as the drain regions of a second set of split gate transistors, wherein the drain portions of the second side of each bit line region are not laterally opposed to the drain portions of the first side of each bit line region.

5. The EPROM array of claim 4 wherein transistors of the first and second sets are alternated one after the other in the longitudinal direction.

6. The EPROM array of claim 4 wherein there is no insulation of a thickness greater than 500 Angstroms interposed between the floating gates of the split gate transistors and the channel regions of those transistors.

7. The array of claim 4 wherein the spacing between a substrate facing surface of each of the floating gates, at substantially all portions of that surface, and the substrate is sufficiently small to enable inducement of substantial inversion in the substrate when the floating gates are not programmably charged to inhibit such inversion.

8. The array of claim 7 wherein said spacing between the substrate and substrate facing surface of each floating gate is substantially constant for all portions of the substrate facing surface.

9. The EPROM array of claim 4 wherein the split gate transistors are arranged in lateral rows and wherein the array further comprises plural word lines extending in the lateral direction to each interconnect the control gates of a single row of split gate transistors, the word lines being shaped such that each word line includes first portions which are narrower than a width dimension of the floating gates and such that the first portions overlap the floating gates.

10. The EPROM array of claim 9 wherein the word lines each include second portions, which are wider than the first portions.

11. The EPROM array of claim 10 wherein the word lines are staggered in the lateral direction so that relatively narrow first portions of one word line are longitudinally aligned with relatively wide second portions of an adjacent word line.

12. A memory array formed on a semiconductor substrate, the array comprising:

first and second split gate transistors each having: a first channel region integrally formed in the substrate; a floating gate insulatively disposed over the first channel region for programmably inhibiting inversion in the first channel region, the floating gate having a bit line defining edge; a source region integrally formed in the substrate and spaced apart from the first channel region; a second channel region integrally formed in the substrate and interposed between the first channel region and the source region; and a drain region integrally formed in the substrate adjacent to the first channel region, the drain region being self-aligned to the bit line defining edge of the floating gate and being partially overlapped by the floating gate; and a bit line region, integrally formed in the substrate to be continuous with and join drain regions of the first and second split gate transistors, the bit line region being elongated in a longitudinal direction so as to have opposed first and second sides extending in the longitudinal direction for a distance substantially larger than the width of the bit line region, wherein the drain regions of the first and second split gate transistors are respectively positioned at the first and second sides of the bit line region.

13. The memory array of claim 12 wherein the first and second split gate transistors respectively belong to first and second laterally extending rows of transistors formed on the substrate, the first and second rows being adjacent to one another.

14. The memory array of claim 12 wherein each of the first and second split gate transistors comprises a control gate portion insulatively disposed over the second channel region, the control gate portion is connected to a conductive word line passing over the floating gate, and at least one portion of the word line, located where the word line passes over the floating gate, is dimensioned narrower than the width of the floating gate.

15. The memory array of claim 12 wherein the spacing between the floating gate of each transistor and the corresponding first channel region of the transistor is at all portions of the floating gate equal to or less than 500 Angstroms.

16. The array of claim 12 wherein the spacing between a substrate facing surface of each of the floating gates, at substantially all portions of that surface, and the substrate is sufficiently small to enable inducement of substantial inversion in the substrate when the floating gates are not programmably charged to inhibit such inversion.

17. The memory array of claim 12 wherein the insulative spacing between the floating gate of each transistor and the first channel region of the transistor is substantially constant for all portions of the floating gate.

18. The array of claim 2 wherein components of the array conform to a predetermined design rule requiring at least a minimal spacing between distinct components and wherein the length of said hypothetical corner to corner line is substantially equal to said minimal spacing.

19. The array of claim 1 wherein each of the first and second floating gates overlaps the first diffused bit line partially by a diffusion-determined distance.

20. The array of claim 19 further comprising a second diffused bit line defined inn the substrate to extend in the longitudinal direction proximate to but spaced apart from the first diffused bit line, the second diffused bit line having opposed left and right edges, wherein a third floating gate, within the second row, partially overlaps a first left edge portion of the second diffused bit line by a diffusion-determined distance;

wherein the second diffused bit line is positioned such that a first split gate transistor is defined by the first floating gate, the first right edge portion of the first diffused bit line serves as a drain region of the first split gate transistor and a facing left edge portion of the second diffused bit line serves as a source region of the first split gate transistor, and wherein the second diffused bit line is positioned such that a second split gate transistor is defined by the third floating gate, the first left edge portion of the second diffused bit line serves as a drain region of the second split gate transistor and a facing right edge portion of the first diffused bit line serves as a source region of the second split gate transistor.

21. The array of claim 20 further comprising a first metal bit line overlying and coupled to the first diffused bit line.

22. The array of claim 21 further comprising a second metal bit line overlying and coupled to the second diffused bit line.

* * * * *